United States Patent
Suzuki

(10) Patent No.: US 8,264,190 B2
(45) Date of Patent: Sep. 11, 2012

(54) CONTROL APPARATUS FOR MULTI-PHASE ROTARY MACHINE AND ELECTRIC POWER STEERING SYSTEM

(75) Inventor: Takashi Suzuki, Obu (JP)

(73) Assignee: Denso Corporation, Kariya (JP)

( * ) Notice: Subject to any disclaimer, the term of this patent is extended or adjusted under 35 U.S.C. 154(b) by 225 days.

(21) Appl. No.: 12/893,156

(22) Filed: Sep. 29, 2010

(65) Prior Publication Data

US 2011/0074333 A1   Mar. 31, 2011

(30) Foreign Application Priority Data

Sep. 30, 2009 (JP) .................................. 2009-227973

(51) Int. Cl.
*H02P 6/12* (2006.01)
(52) U.S. Cl. ........ 318/724; 318/432; 318/433; 318/434; 318/802; 318/803
(58) Field of Classification Search .................. 318/724, 318/432–434, 802–803
See application file for complete search history.

(56) References Cited

U.S. PATENT DOCUMENTS

| | | | |
|---|---|---|---|
| 6,232,731 B1* | 5/2001 | Chapman | 318/801 |
| 2005/0073273 A1 | 4/2005 | Maslov et al. | |
| 2007/0176577 A1 | 8/2007 | Kezobo et al. | |
| 2009/0021207 A1 | 1/2009 | Kezobo et al. | |

FOREIGN PATENT DOCUMENTS

| | | |
|---|---|---|
| JP | 2005-304119 | 10/2005 |
| JP | P2005-312234 A | 11/2005 |
| JP | P2007-507998 A | 3/2007 |
| JP | P2009-055657 A | 3/2009 |
| WO | WO 2007/129359 | 11/2007 |

* cited by examiner

*Primary Examiner* — Bentsu Ro
*Assistant Examiner* — David Luo
(74) *Attorney, Agent, or Firm* — Nixon & Vanderhye PC

(57) ABSTRACT

A control apparatus for a multi-phase rotary machine includes a control unit and a plurality of power supply systems including respective inverter units. When a short-circuiting failure occurs in one of the systems due to an ON-failure in any one of FETs in an inverter unit of the failure system, the control unit stops driving of the rotary machine by bringing all the FETs in the failure system into the OFF state. The control unit controls FETs of the non-failure system such that a brake torque generated in the failure system is cancelled or the influence of the brake torque exerted on the driving of the motor is reduced.

16 Claims, 21 Drawing Sheets

| | VOLTAGE VECTOR PATTERN | ON | | |
|---|---|---|---|---|
| | | U | V | W |
| ZERO | V0 | FET 24 | FET 25 | FET 26 |
| EFFECTIVE | V1 | FET 21 | FET 25 | FET 26 |
| | V2 | FET 21 | FET 22 | FET 26 |
| | V3 | FET 24 | FET 22 | FET 26 |
| | V4 | FET 24 | FET 22 | FET 23 |
| | V5 | FET 24 | FET 25 | FET 23 |
| | V6 | FET 21 | FET 25 | FET 23 |
| ZERO | V7 | FET 21 | FET 22 | FET 23 |

FIG. 4A (V0)
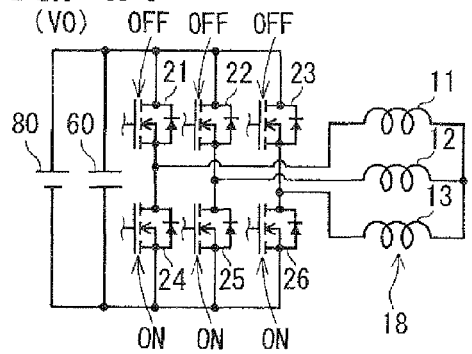
FIG. 4B (V1)
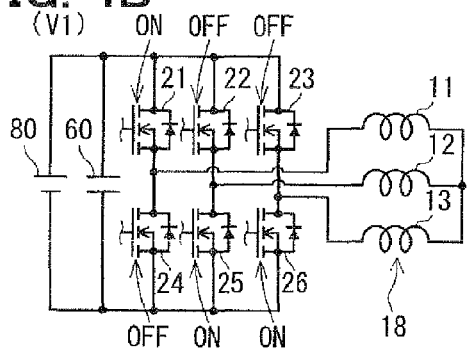
FIG. 4C (V2)
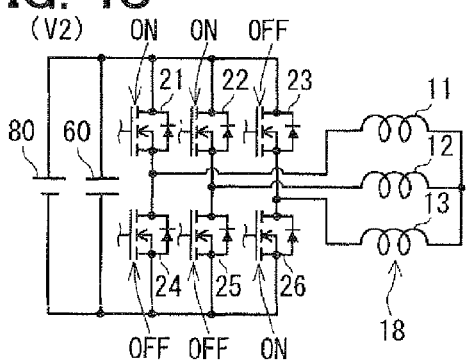
FIG. 4D (V3)
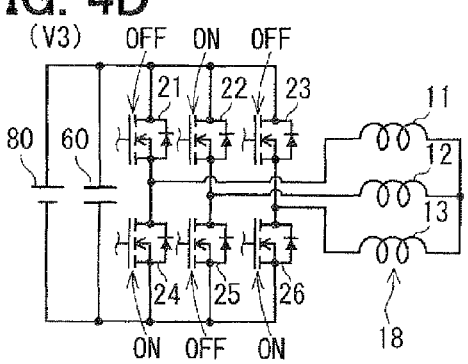
FIG. 4E (V4)
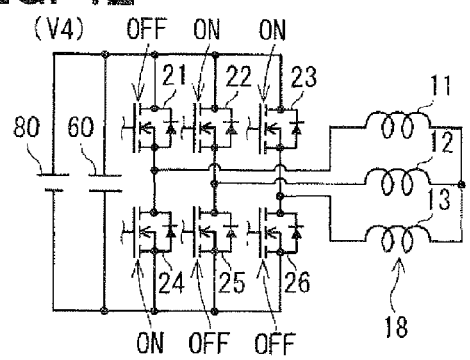
FIG. 4F (V5)
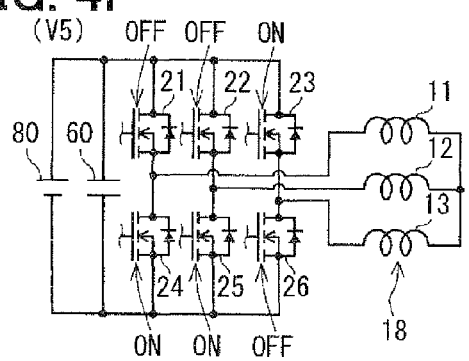
FIG. 4G (V6)
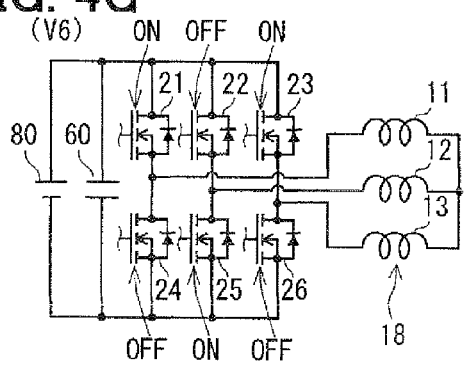
FIG. 4H (V7)
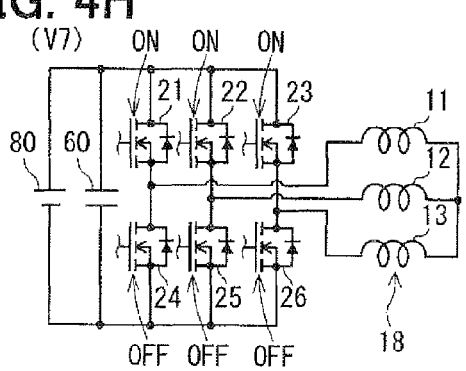

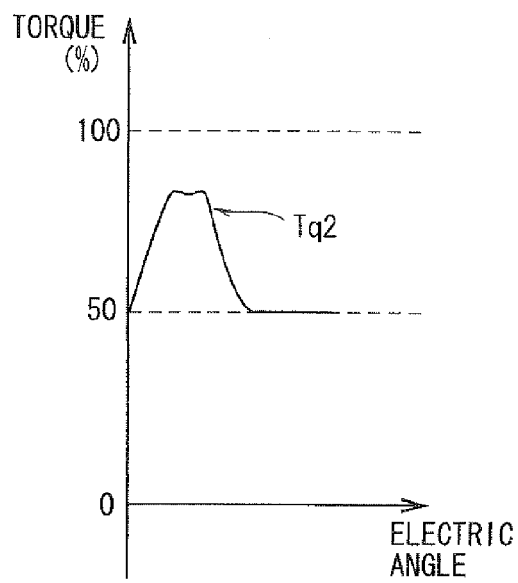
FIG. 9A
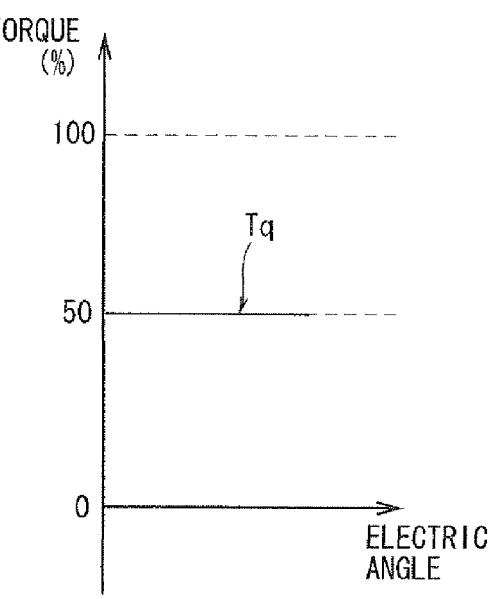
FIG. 9B
FIG. 10
| VOLTAGE DETECTION | VPIG | GND |
|---|---|---|
| FIRST SYSTEM 51 | FET 21 | FET 24 |
| 52 | FET 22 | FET 25 |
| 53 | FET 23 | FET 26 |
| SECOND SYSTEM 54 | FET 31 | FET 34 |
| 55 | FET 32 | FET 35 |
| 56 | FET 33 | FET 36 |
← ON-FAILURE FET

CONTROL APPARATUS FOR MULTI-PHASE ROTARY MACHINE AND ELECTRIC POWER STEERING SYSTEM

CROSS REFERENCE TO RELATED APPLICATION

This application is based on and incorporates herein by reference Japanese patent application No. 2009-227973 filed on Sep. 30, 2009.

FIELD OF THE INVENTION

The present invention relates to a control apparatus for a multi-phase rotary machine and an electric power steering system using the control apparatus.

BACKGROUND OF THE INVENTION

A conventional control apparatus for a multi-phase rotary machine controls a multi-phase rotary machine by controlling ON/OFF switching of a plurality of switching elements. In such a control apparatus for a rotary machine, it is proposed by the following patent documents to allow the rotary machine to continue its operation even when a failure occurred in a part of the switching element.
Patent document 1: US 2007/0176577 A1 (WO 2005/091488 A1)
Patent document 2: JP 2005-304119A In patent document 1, when the OFF failure (a failure in which a switching element is always held in a non-conductive state) occurs in one of the switching elements, the control apparatus continues to drive the rotary machine to operate. However, when the ON failure (a failure in which a switching element is always held in a conductive state) occurs in one of the switching elements, the control apparatus does not continue to drive the rotary machine.

In patent document 2, when the ON failure occurred in one of the switching elements, the control apparatus continues to drive the rotary machine by one of a plurality of inverters. When the ON failure occurred in one of the switching elements, a coil in each phase of the rotary machine and a power source or a ground become conductive with each other. When the rotary machine is driven in such a state, an induction voltage is generated in the rotary machine. Due to this induction voltage, a torque which resists the driving (hereinafter referred to as brake torque) is generated in the rotary machine. The brake torque is increased as a rotational speed of the rotary machine increases. Further, since the induction voltage is a sinusoidal wave voltage, the brake torque changes with an electrical angle. Accordingly, when the rotary machine is continued to be driven by the non-failure inverter, the output torque of the rotary machine also changes with the change in the brake torque.

SUMMARY OF THE INVENTION

It is an object of the present invention to provide a control apparatus for a multi-phase rotary machine which can, when an ON failure occurred in one of switching elements or when a winding of a rotary machine and a power source are short-circuited, suppresses the influence of a brake torque which is generated in a failure system or the influence of a change of an output of the failure system from being exerted on the driving of the rotary machine so that the stable driving of the rotary machine can be continued.

According to the present invention a control apparatus is provided for controlling driving of a multi-phase rotary machine including a plurality of winding sets, each of which is formed of a plurality of windings corresponding to a plurality of phases, respectively. The control apparatus comprises a plurality of inverter units and the control unit. The inverter units forms a plurality of systems of power supply from a power source to the winding sets. Each of the inverter units has a plurality of legs provided in correspondence to the plurality of phases. Each of the legs includes a high-side switching element and a low-side switching element. The control unit drives the rotary machine by calculating a voltage command value, which is a command value of a voltage applied to each of the windings, and by controlling ON/OFF switching of the high-side switching element and the low-side switching element based on the voltage command value. The control unit is configured to perform either one of the following controls, in a case where a short-circuiting failure occurred in a failure system which is one of the plurality of systems and has a short-circuiting failure, the short-circuiting failure causing the winding of the rotary machine to be continuously conductive to the power source even when the high-side switching element and the low-side switching element are controlled to assume the OFF states.

In one aspect, the control unit stops driving the rotary machine, which is performed by the failure system, by controlling all of the high-side switching element and the low-side switching element of each leg in the failure system into OFF states, respectively. The control unit continues to drive the rotary machine by a no-failure system, which is one of the plurality of systems and has no short-circuit failure. The control unit controls the high-side switching element and the low-side switching element of each leg in a no-failure system of the plurality of systems such that an output is cancelled or an influence of the output exerted on the driving of the rotary machine is reduced, the output being generated when driving the rotary machine by the first system is stopped and resistive to driving of the rotary machine.

In another aspect, the control unit continues to drive the rotary machine by a no-failure leg, which has no short-circuiting failure, in the failure system, and by a no-failure system, which is one of the plurality of systems and has no short-circuiting failure. The control unit controls the high-side switching element and the low-side switching element of each leg in the no-failure system, such that a variation in an output of the failure system is cancelled or an influence of the variation in the output on the driving of the rotary machine is reduced, the variation in the output of the failure system being caused by driving the rotary machine by only the non-failure leg of the failure system.

BRIEF DESCRIPTION OF THE DRAWINGS

The above and other objects, features and advantages of the present invention will become more apparent from the following detailed description made with reference to the accompanying drawings. In the drawings:

FIG. 4A to FIG. 4H are circuit diagrams showing an ON/OFF state of a switching element corresponding to each voltage vector, wherein FIG. 4A shows a state corresponding to a voltage vector V0, FIG. 4B shows a state corresponding to a voltage vector V1, FIG. 4C shows a state corresponding to a voltage vector V2, FIG. 4D shows a state corresponding to a voltage vector V3, FIG. 4E shows a state corresponding to a voltage vector V4, FIG. 4F shows a state corresponding to a voltage vector V5, FIG. 4G shows a state corresponding to a voltage vector V6, and FIG. 4H shows a state corresponding to a voltage vector V7;

FIG. 5A to FIG. 5C are signal diagrams showing an operation of the control apparatus according to the first embodiment at a normal state, wherein FIG. 5A shows a voltage applied to respective phases, FIG. 5B shows currents which flow in the respective phases, and FIG. 5C shows output torques of a rotary machine;

FIG. 6A and FIG. 6B are diagrams showing a current which flows in a failure system when the rotary machine is rotated in a state where the ON failure occurred in one of the switching elements, wherein FIG. 6A shows a current when a rotational speed of the rotary machine assumes a certain value, and FIG. 6B shows the relationship between the rotational speed and the current in the rotary machine;

FIG. 7A and FIG. 7B are diagrams showing the output torque of the rotary machine when a short-circuiting failure occurred, wherein FIG. 7A shows a torque generated by a failure system, and FIG. 7B shows the output torque of the rotary machine;

FIG. 8A and FIG. 8B are diagrams for explaining a control in an abnormal state by the control apparatus according to the first embodiment, wherein FIG. 8A shows a control unit which controls a failure system, and FIG. 8B shows a control unit which controls the ON failure system;

FIG. 9A and FIG. 9B are diagrams showing a torque outputted from a rotary machine by a control which the control apparatus according to the first embodiment performs in an abnormal state, wherein FIG. 9A shows the output torque generated by the ON failure system and FIG. 9B shows the output torque of the rotary machine;

FIG. 10 is a table showing the correspondence between a detection value of the voltage detection part and a switching element in which the presence of a failure is specified;

FIG. 13A and FIG. 13B are diagrams showing a torque which is outputted from a rotary machine by a control which the control apparatus according to the second embodiment performs in an abnormal state; wherein FIG. 13A shows the output torque generated by the ON failure system and FIG. 13B shows the output torque of the rotary machine;

FIG. 14A to FIG. 14C are diagrams showing an operation of driving of a rotary machine by a failure system, wherein FIG. 14A shows voltages applied to respective phases, FIG. 14B shows currents which flow in the respective phases, and FIG. 14C shows the output torque of a rotary machine by a failure system;

FIG. 15A to FIG. 15C are diagrams relating to a control apparatus according to a third embodiment of the present invention and the operation of driving of a rotary machine in a failure system, wherein FIG. 15A shows voltages applied to respective phases, FIG. 15B shows currents which flow in the respective phases, and FIG. 15C shows the output torque of a rotary machine by a failure system;

FIG. 16A to FIG. 16E are diagrams relating to the control apparatus according to the third embodiment and showing a torque which can be outputted by a failure system, wherein FIG. 16A shows a torque when a failure occurred in a V-phase high-side FET, FIG. 16B shows a torque when a failure occurred in a W-phase high-side FET, FIG. 16C shows a torque when a failure occurred in a U-phase low-side FET, FIG. 16D shows a torque when a failure occurred in a V-phase low-side FET, and FIG. 16E shows a torque when a failure occurred in a W-phase low-side FET;

FIG. 17A and FIG. 17B are block diagrams showing a control by the control apparatus according to the third embodiment in an abnormal state, wherein FIG. 17A shows the control unit which controls a failure system, and FIG. 17B shows the control unit which controls the ON failure system;

FIG. 18A and FIG. 18B are diagrams showing a torque which is outputted from a rotary machine by a control which the control apparatus according to the third embodiment performs in an abnormal state; wherein FIG. 18A shows the output torque generated by the ON failure system and FIG. 18B shows the output torque of the rotary machine;

FIG. 19A and FIG. 19B are diagrams relating to the control apparatus according to the third embodiment and showing a torque outputted from a failure system when the rotary machine is rotated, wherein FIG. 19A is a view when the rotary machine is rotated at a low speed, and FIG. 19B is a view when the rotary machine is rotated at a high speed;

DETAILED DESCRIPTION OF THE PREFERRED EMBODIMENTS

A control apparatus according to the present invention is described in detail with respect to a plurality of embodiments, in which same symbols designate the same or similar parts and functions.

First Embodiment

Figure 1:
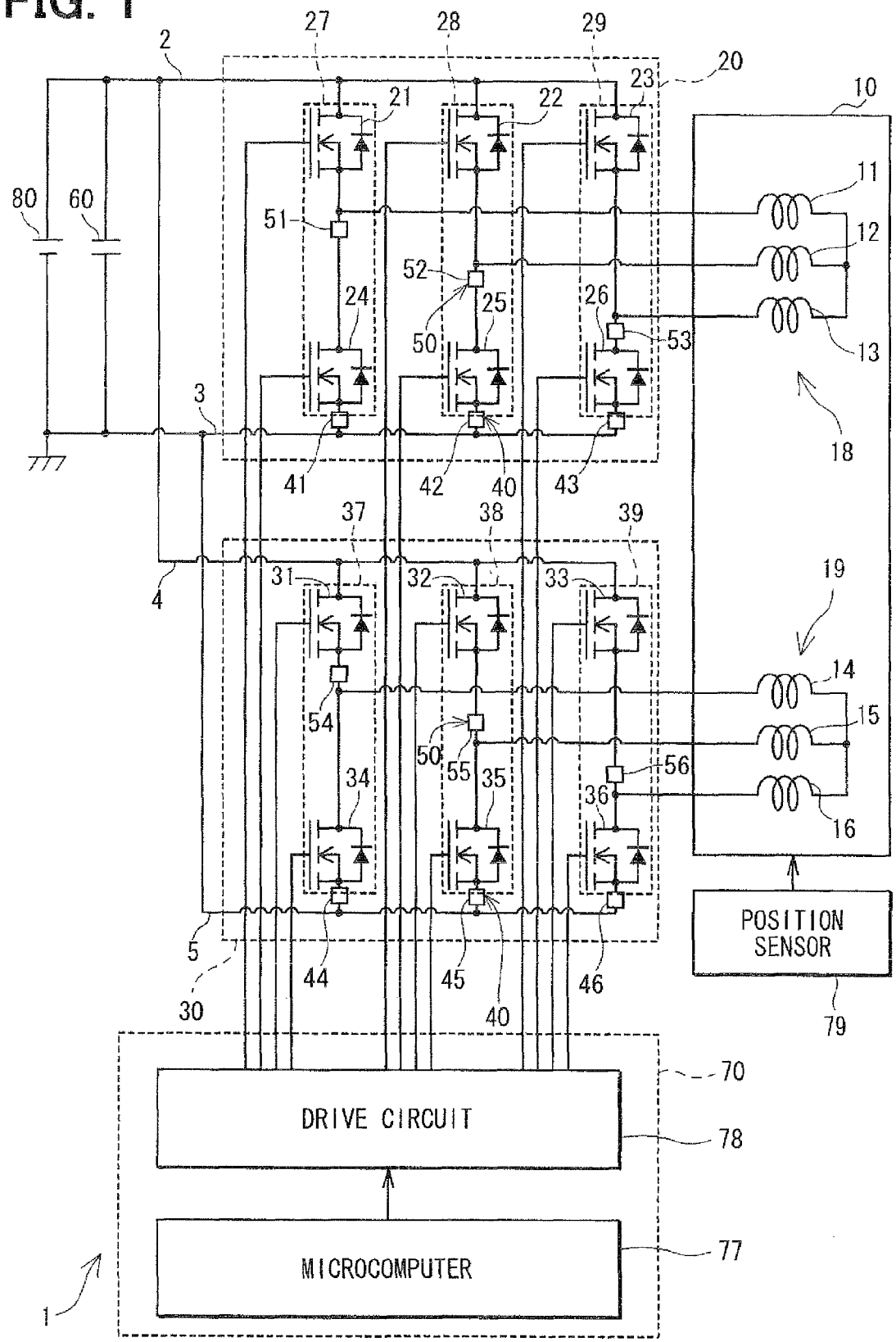
FIG. 1 is a circuit diagram showing a control apparatus according to a first embodiment of the present invention.

As shown in FIG. 1, a control apparatus 1 is provided to perform a drive control of an electric motor 10, which is a rotary machine. The control apparatus 1 is adopted, for example, for an electric power steering system which power-assists a steering operation of a vehicle by the motor 10.

The motor 10 is a three-phase brushless motor and includes a rotor and a stator (not shown). The rotor is a cylindrical body, mounts permanent magnets on its surface, and has magnetic poles. The stator houses the rotor therein and rotatably supports the rotor. The stator includes protruding portions which protrude radially inward at an interval of predetermined angle in the circumferential direction. A U1 coil 11, a V1 coil 12, a W1 coil 13, a U2 coil 14, a V2 coil 15 and a W2 coil 16 are wound around these protruding portions. The U1 coil 11, the V1 coil 12 and the W1 coil 13 form a U-phase coil, a V-phase coil and a W-phase coil of a first winding set 18, respectively. The U2 coil 14, the V2 coil 15 and the W2 coil 16 form a U-phase coil, a V-phase coil and a W-phase coil of a second winding set 19, respectively. The first winding set 18 and the second winding set 19 correspond to a plurality of winding sets. Further, the motor 10 includes a position sensor 79 which detects a rotational position of the motor 10.

The control apparatus 1 includes a first inverter unit 20, a second inverter unit 30, a current detection part 40, a voltage detection part 50, a capacitor 60, a control unit 70, a battery 80 and the like.

The first inverter unit 20 is a three-phase inverter, wherein six switching elements 21 to 26 are connected to each other in a bridge circuit configuration for changing over the supply of electricity to the U1 coil 11, the V1 coil 12 and the W1 coil 13 of the first winding set 18, respectively. The switching elements 21 to 26 are formed of a metal-oxide-semiconductor field-effect transistor which is a kind of field effect transistor. Hereinafter, the switching elements 21 to 26 are referred to as FETs 21 to 26.

In each of three FETs 21 to 23, a drain is connected to a high side bus 2 which is connected to a positive pole side (high-side) of the battery 80. Sources of the FETs 21 to 23 are connected to drains of the FETs 24 to 26, respectively. Sources of the FETs 24 to 26 are connected to a low side bus 3 which is connected to a negative pole side (low-side) of the battery 80. The battery 80 is grounded at the negative pole side.

A node between the FET 21 and the FET 24 which form a first pair is connected to one end of the U1 coil 11. A node between the FET 22 and the FET 25 which form a second pair is connected to one end of the V1 coil 12. A node between the FET 23 and the FET 26 which form a third pair is connected to one end of the W1 coil 13.

The second inverter unit 30 is also a three-phase inverter in the same manner as the first inverter unit 20, wherein six switching elements 31 to 36 are connected to each other in bridge circuit configuration for changing over the supply of electricity to the U2 coil 14, the V2 coil 15 and the W2 coil 16 of the second winding set 19, respectively. The switching elements 31 to 36 are, in the same manner as the switching elements 21 to 26, formed of FETs. Hereinafter, the switching elements 31 to 36 are referred to as FETs 31 to 36.

In each of three FETs 31 to 33, a drain is connected to a high side bus 4 which is connected to the positive pole side of the battery 80. Sources of the FETs 31 to 33 are connected to drains of the FETs 34 to 36, respectively. Sources of the FETs 34 to 36 are connected to a low side bus 5 which is connected to a negative pole side of the battery 80.

A node between the FET 31 and the FET 34 which form a first pair is connected to one end of the U2 coil 14. A node between the FET 32 and the FET 35 which form a second pair is connected to one end of the V2 coil 15. A node between the FET 33 and the FET 36 which form a third pair is connected to one end of the W2 coil 16.

Here, the FETs 21 to 23 correspond to high-side switching elements in the first inverter unit 20, and the FETs 31 to 33 correspond to high-side switching elements in the second inverter unit 30. Further, the FETs 24 to 26 correspond to low-side switching elements in the first inverter unit 20, and the FETs 34 to 36 correspond to low-side switching elements in the second inverter unit 30. Hereinafter, high-side switching elements are referred to as high-side FETs" when neces-sary, and low-side switching elements are referred to as low-side FETs when necessary. Further, when necessary, the switching element is also indicated together with a phase which corresponds to the switching element such as U low-side FET 24.

Further, each pair of high-side FET and the low-side FET in each phase is referred to as a leg. That is, in this embodiment, the first inverter unit 20 includes a leg 27 which is formed of the U high-side FET 21 and the U low-side FET 24, a leg 28 which is formed of the V high-side FET 22 and the V low-side FET 25, and a leg 29 which is formed of the W high-side FET 23 and the W low-side FET 26. Further, the second inverter unit 30 includes a leg 37 which is formed of the U high-side FET 31 and the U low-side FET 34, a leg 38 which is formed of the V high-side FET 32 and the V low-side FET 35, and a leg 39 which is formed of the W high-side FET 33 and the W low-side FET 36. High-side s of the legs 27 to 29 are connected to the high side bus 2, and low-side s of the legs 27 to 29 are connected to the low side bus 3. High-side s of the legs 37 to 39 are connected to the high side bus 4, and low-side s of the legs 37 to 39 are connected to the low side bus 5.

The control apparatus 1 thus includes a plurality of inverter systems. That is, the control apparatus 1 includes the first inverter unit 20 which forms one system and the second inverter unit 30 which forms the other system. Hereinafter, the system which includes the first inverter unit 20 is referred to as a first system, and the other system which includes the second inverter unit 30 is referred to as a second system, when necessary.

The current detection part 40 is formed of a U1 current detection part 41, a V1 current detection part 42, a W1 current detection part 43, a U2 current detection part 44, a V2 current detection part 45 and a W2 current detection part 46. The U1 current detection part 41 is provided between the U low-side FET 24 and the bus 3 and detects a current which flows in the U1 coil 11. The V1 current detection part 42 is provided between the V low-side FET 25 and the bus 3 and detects a current which flows in the V1 coil 12. The W1 current detection part 43 is provided between the W low-side FET 26 and the bus 3 and detects a current which flows in the W1 coil 13. Further, the U2 current detection part 44 is provided between the U low-side FET 34 and the bus 5 and detects a current which flows in the U2 coil 14. The V2 current detection part 45 is provided between the V low-side FET 35 and the bus 5 and detects a current which flows in the V2 coil 15. The W2 current detection part 46 is provided between the W low-side FET 36 and the bus 5 and detects a current which flows in the W2 coil 16.

The current detection parts 41 to 46 may be shunt resistors. Detection values detected by the current detection parts 41 to 46 (hereinafter referred to as current detection values) are stored in a memory in the control unit 70. Here, a rotational angular position θ of the motor 10 is simultaneously acquired using the position sensor 79.

The voltage detection part 50 is formed of a U1 voltage detection part 51, a V1 voltage detection part 52, a W1 voltage detection part 53, a U2 voltage detection part 54, a V2 voltage detection part 55 and a W2 voltage detection part 56. The U1 voltage detection part 51 is provided between the U high-side FET 21 and the U low-side FET 24 and detects a voltage applied to the U1 coil 11. The V1 voltage detection part 52 is provided between the V high-side FET 22 and the V low-side FET 25 and detects a voltage applied to the V1 coil 12. The W1 voltage detection part 53 is provided between the W high-side FET 23 and the W low-side FET 26 and detects a voltage applied to the W1 coil 13. Further, the U2 voltage detection part 54 is provided between the U high-side FET 31 and the U low-side FET 34 and detects a voltage applied to the U2 coil 14. The V2 voltage detection part 55 is provided between the V high-side FET 32 and the V low-side FET 35 and detects a voltage applied to the V2 coil 15. The W2 voltage detection part 56 is provided between the W high-side FET 33 and the W low-side FET 36 and detects a voltage applied to the W2 coil 16.

Detection values detected by the voltage detection parts 51 to 56 (hereinafter referred to as voltage detection values) are stored in a memory in the control unit 70. Here, signal lines leading to the control unit 70 from the current detection part 40, the voltage detection part 50 and the position sensor 79 are not shown in FIG. 1 for brevity.

The capacitor 60 is connected to the battery 80, the first inverter unit 20 and the second inverter unit 30 and stores a charge therein thus assisting the supply of electricity to the FETs 21 to 26, 31 to 36 and suppressing noise components such as a surge current.

Figures 2, 3:
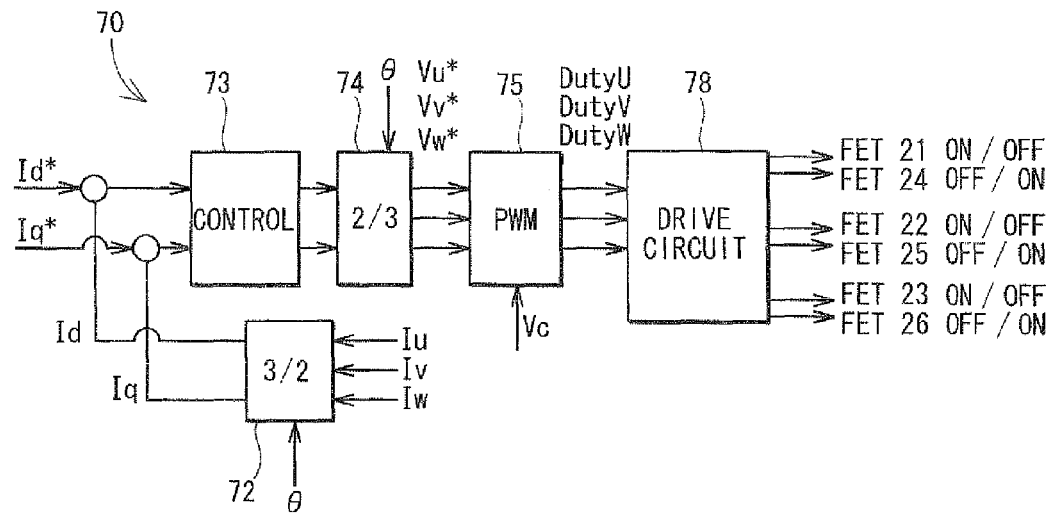
FIG. 2 is a block diagram showing a control unit of the control apparatus according to the first embodiment and an operation under a normal state.
FIG. 3 is a table showing voltage vectors outputted based on a PWM control.

The control unit 70 is in charge of a control of the whole control apparatus 1, and is formed of a microcomputer 77, a drive circuit 78 and the like such as a memory. The detailed configuration of the control unit 70 is shown in FIG. 2. Specifically, the control unit 70 includes a three/two phase converting part 72, a controller 73, a two/three phase converting part 74, a PWM signal generation part 75 and the like.

Here, the control processing at a normal time (at a normal state) in the control unit 70 is simply described in conjunction with FIG. 2. Although the control processing in the first inverter unit 20 is described here, the similar control is performed also in the second inverter unit 30.

The three/two phase converting part 72 reads current detection values, which are detected by the current detection parts 41 to 43 and are stored in the memory. Further, the three/two phase converting part 72 calculates a current value Iu of the U1 coil 11, a current value Iv of the V1 coil 12 and a current value Iw of the W1 coil 13 based on the current detection values, and a d-axis current detection value Id and a q-axis current detection value Iq are calculated based on the calculated three-phase current values Iu, Iv, Iw and the motor rotational position θ acquired by the position sensor 79.

The controller 73 performs a current feedback control arithmetic operation based on a d-axis command current Id*, a q-axis command current Iq*, the d-axis current detection value Id and the q-axis current detection value Iq thus calculating a d-axis command voltage Vd and a q-axis command voltage Vq. To be more specific, a d-axis current deviation ΔId between the d-axis command current Id* and the d-axis current detection value Id and a q-axis current deviation ΔIq between the q-axis command current Iq* and the q-axis current detection value Iq are calculated, and the d-axis command voltage Vd and the q-axis command voltage Vq are calculated such that the current deviations ΔId, ΔIq are converged to 0 so as to follow the command currents Id*, Iq*.

The two/three phase converting part 74 calculates a U-phase command voltage Vu*, a V-phase command voltage V1I* and a W-phase command voltage Vw* which are three-phase voltage command values based on the command voltages Vd, Vq calculated by the controller 73 and the motor rotational position θ.

The PWM signal generation part 75 calculates a U-phase duty Du, a V-phase duty Dv and a W-phase duty Dw which are duty command signals based on the three-phase voltages Vu*, V1I*, Vw* and the capacitor voltage Vc, and stores the U-phase duty Du, the V-phase duty Dv, and the W-phase duty Dw in the memory.

Then, in the drive circuit 78, ON-OFF switching timings of the FETs 21 to 26 are controlled by comparing a duty command signal and a PWM reference signal.

Subsequently, a PWM control performed by the control apparatus 1 is described next.

Voltage vector patterns shown in FIG. 3 are patterns which respectively indicate three FETs which assume the ON state out of the FETs 21 to 26, and the voltage vector patterns V0 to V7 are present. Here, the voltage vector pattern V0 is a pattern in which all of the low-side FETs 24 to 26 assume the ON state. Further, the voltage vector pattern V7 is a pattern in which all of the high-side FETs 21 to 23 assume the ON state.

The drive circuit 78 compares the U-phase duty Du, the V-phase duty Dv and the W-phase duty Dw with the PWM reference signal which has a triangular waveform, and generates ON/OFF signals of the FETs 21 to 26 such that the voltage vector pattern assumes one of the voltage vector patterns V0 to V7. The FETs 21 to 26 respectively receive the ON/OFF signals from the drive circuit 78, and are switched to the ON state or the OFF state in accordance with the signals. FIG. 4A to FIG. 4H respectively show the ON/OFF state of the FETs 21 to 26 when the FETs 21 to 26 respectively receive the ON/OFF signals based on the voltage vector patterns V0 to V7. As shown in FIG. 4A and FIG. 4H, in the voltage vector patterns V0 and V7, all of the FETs 21 to 23 or all of the FETs 24 to 26 assume the OFF state and, hence, the voltage vector becomes the zero voltage vector where a voltage is not applied to the motor 10 (first winding set 18). On the other hand, as shown in FIG. 4B to FIG. 4G, in the voltage vector patterns V1 to V6, the voltage vector becomes an effective voltage vector where a voltage is applied to the motor 10 (first winding set 18).

Figure 5A:
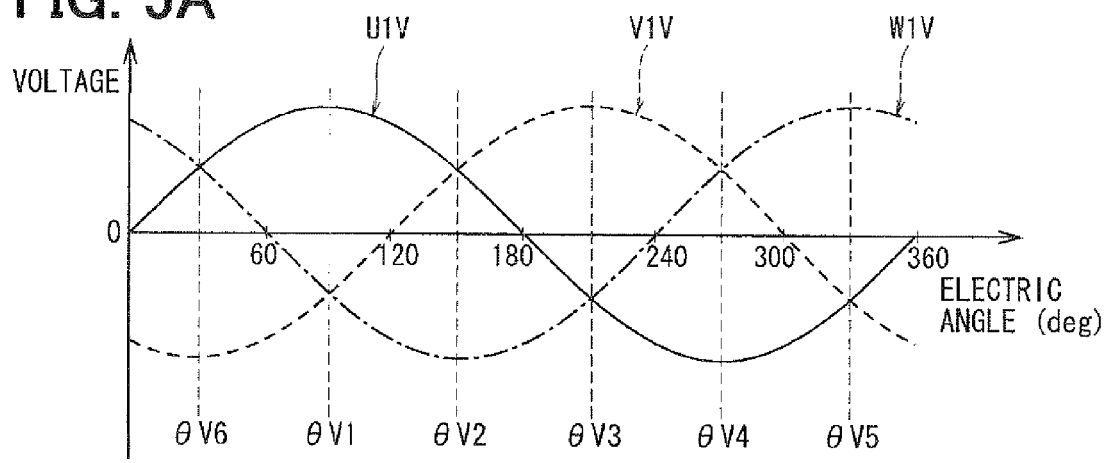

Due to the ON/OFF control of the FETs 21 to 26 by the drive circuit 78, the voltages (U1V, V1V, W1V) shown in FIG. 5A are ideally applied to the coils (U1 coil 11, V1 coil 12, W1 coil 13) of the respective phases (U-phase, V-phase, W-phase). In FIG. 5A, voltage vectors when an electric angle is θV6 (30 deg) are V6, V0, V7 respectively. Further, voltage vectors when the electric angle is θV1 to θV5 are V1 to V5 and V0, V7 respectively. Further, the voltage vector between the electric angle θV1 (90 deg) and the electric angle θV2 (150 deg) is V1, V2, V0 or V7. In this manner, due to a continuous change of the voltage vector, sinusoidal voltages shown in FIG. 5A are applied to the coils of respective phases.

Figure 5B:
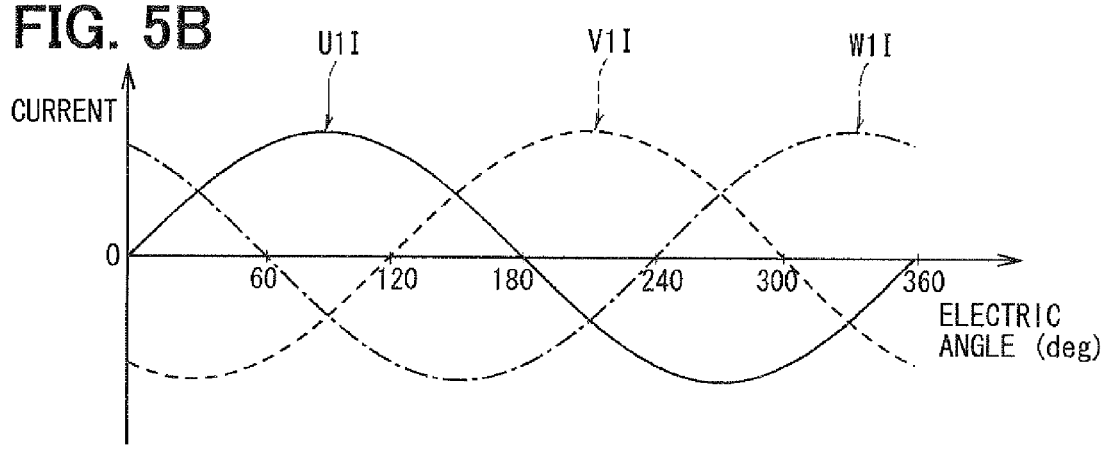
Figure 5C:
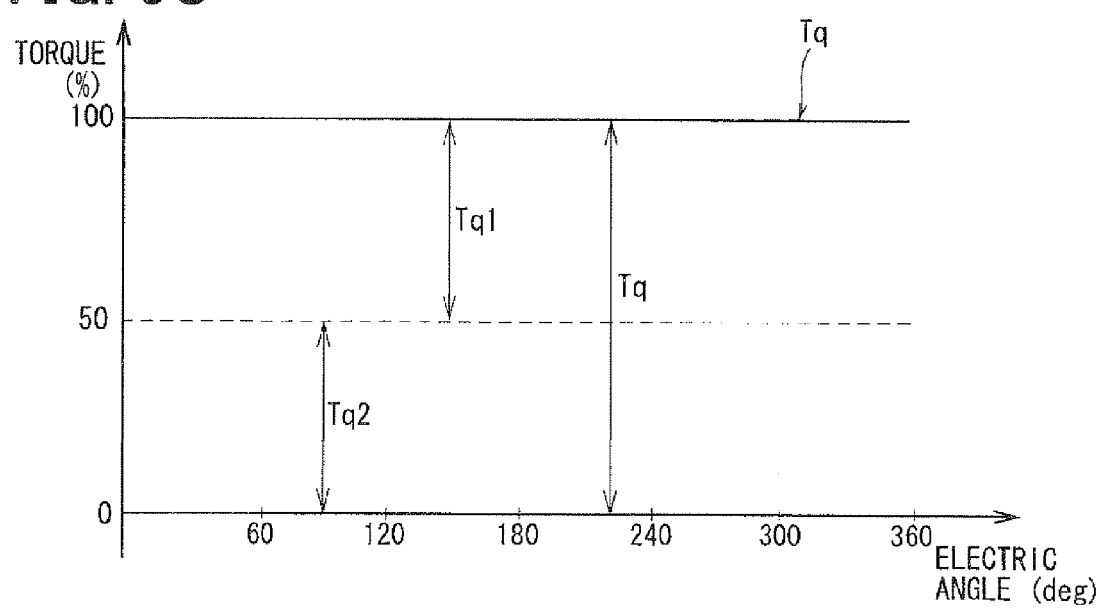

When the voltages shown in FIG. 5A are applied to the coils of the respective phases, currents (U1I, V1I, W1I) which correspond to the applied voltages flow in the respective coils (U1 coil 11, V1 coil 12, W1 coil 13) respectively as shown in FIG. 5B. A torque (Tq1) is generated in the motor 10 by the first inverter unit 20 (first system). The second inverter unit 30 (second system) is also controlled in the substantially same manner as the first inverter unit 20. Accordingly, a torque (Tq) which is obtained by adding a torque (Tq1) generated by the first inverter unit 20 and a torque (Tq2) generated by the second inverter unit 30 together is generated in the motor 10 as shown in FIG. 5C. As a result, the output torque (Tq) of the motor 10 which is driven and controlled by the control apparatus 1 in a normal state is maintained at a fixed value when the motor 10 is rotated at a fixed rotational speed. Here, assuming that the output torque Tq of the motor 10 as a whole (sum of the torque generated by the first inverter unit 20 and the torque generated by the second inverter unit 30) as 100%, the torque generated by the first inverter unit 20 and the torque generated by the second inverter unit 30 assume 50% of the torque Tq respectively.

The control apparatus 1 is characterized by the manner of controlling the first inverter unit 20 and the second inverter unit 30 by the control unit 70, when a failure occurred in the control apparatus 1, particularly when the ON failure occurred causing one of the FETs 21 to 26, 31 to 36 to continuously assume the ON state without being turned to the OFF state.

When the control unit 70 determines that the ON failure occurred in one of the FETs 21 to 26, 31 to 36, the control unit 70 performs a unique control such that all FETs (FETs 21 to 26 or the FETs 31 to 36) in the system (first system or second system) which includes a failure FET are brought into the OFF state. That is, at this time, the control unit 70 stops the driving of the motor 10 by the failure system, which includes the failure FET.

Firstly, the description is made with respect to a phenomenon which is induced in the motor 10 when the ON failure occurred in one of the FETs 21 to 26, 31 to 36.

For example, when the ON failure occurred in the U high-side FET 21, the U1 coil 11 (U-phase of the first winding set 18) and the high side bus 2 are short-circuited thus becoming conductive with each other (FIG. 1). Here, a power source voltage is applied to the U1 coil 11 from the battery 80. Hereinafter, such a state is referred to as the voltage short-circuiting state when necessary, and such a failure which brings about the voltage short-circuiting state is referred to as a short-circuiting failure when necessary. When the ON failure occurred in the U low-side FET 24, for example, the U1 coil 11 and the low side bus 3 are short-circuited thus becoming conductive with each other. Hereinafter, such a state is referred to as the ground short-circuiting state when necessary, and a failure which brings about the ground short-circuiting state is also referred to as a short-circuiting failure. The manner of determining the presence or non-presence of the occurrence of the short-circuiting failure and the manner of specifying the FET in which the ON failure occurred by the control unit 70 are described in detail later.

When the U1 coil 11 assumes the voltage short-circuiting state, the control unit 70 performs a control such that all of the FETs 21 to 26 in the first system are brought into the OFF state. Although the FETs 22 to 26 assume the OFF state due to such a control, the FET 21 is continuously held in the ON state because of its ON failure. When the motor 10 is rotated in this state, an induction voltage is generated in the first winding set 18 so that currents shown in FIG. 6A flow in the first winding set 18. A current U1I flows in the U1 coil 11 (U-phase), a current V1I flows in the V1 coil 12 (V-phase), and a current W1I flows in the W1 coil 13. Further, as shown in FIG. 6B, when the motor 10 is rotated in a state where the ON failure occurred only in the FET 21, along with the increase of a rotational speed of the motor 10, absolute values of the respective currents (U1I, V1I, W1I) which flow in the first winding set 18 are increased.

Figure 6A:
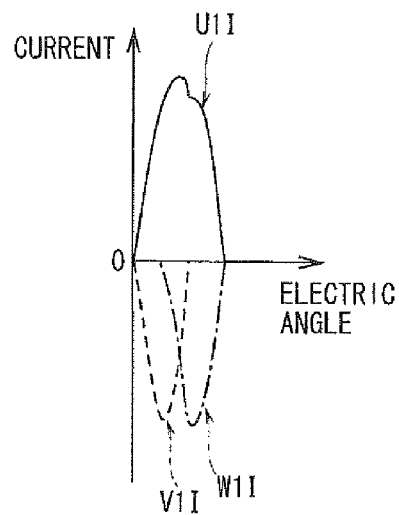
Figure 6B:
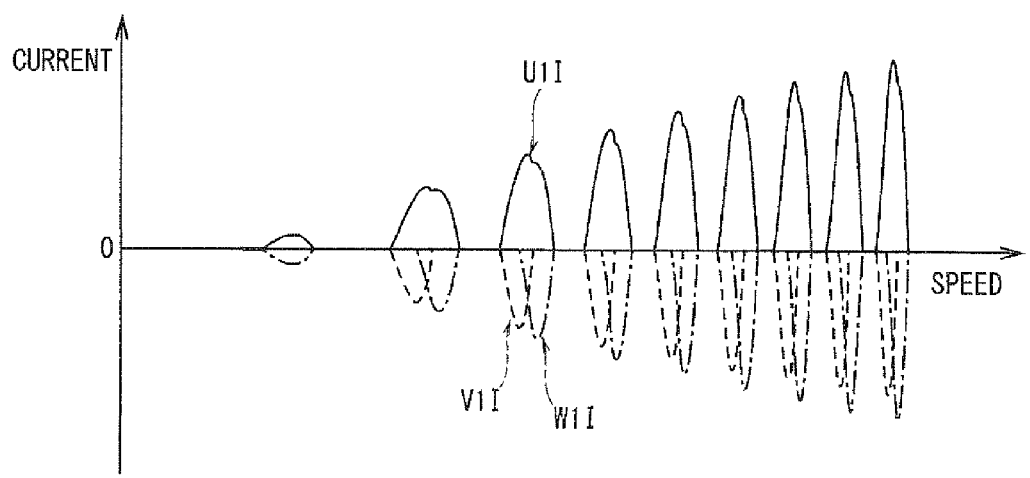
Figure 7A:
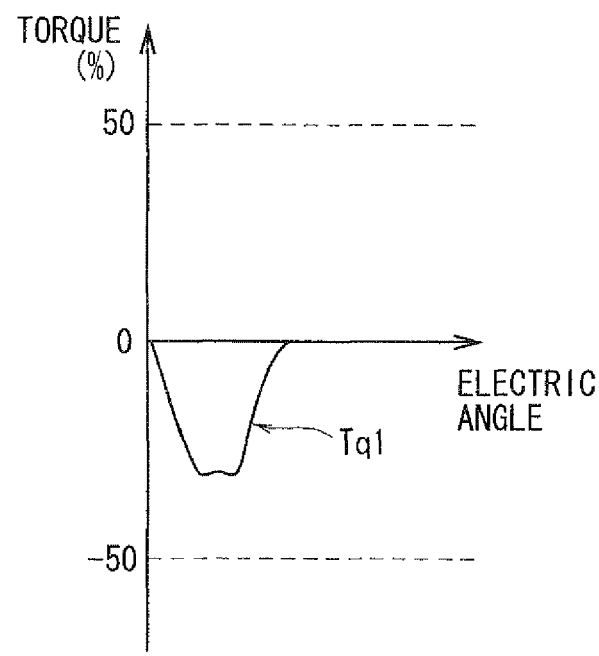
Figure 7B:
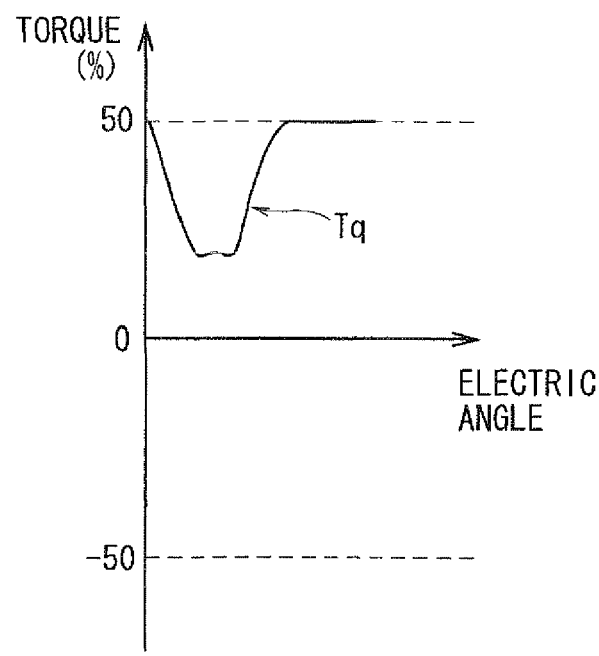

When the currents shown in FIG. 6A flow in the first winding set 18, the output torque (Tq1) of the motor 10 generated by the first inverter unit 20 (first system) becomes a negative output at an electric angle which falls within a predetermined range as shown in FIG. 7A. Such a negative torque becomes a torque (brake torque) which resists the driving of the motor 10. When the output torque (Tq1) of the motor 10 generated by the first inverter unit 20 (first system) is the torque shown in FIG. 7A, the output torque Tq of the motor 10 as a whole (sum of the torque generated by the first system and the torque generated by the second system) takes a value shown in FIG. 7B. As shown in FIG. 7B, when a failure occurred in the FET in the first system so that the driving of the motor 10 by the first system is stopped and the motor 10 is driven only by the second system, with respect to the output torque Tq of the motor 10 as a whole, the maximum value of the output torque Tq in the failure state becomes 50% of the total output torque generated in a normal state, and the output torque in the failure state becomes 50% or less of the output torque in the normal state at an electric angle which falls within the predetermined range. Accordingly, when the motor 10 is used for the electric power steering system, the assist force is halved compared to the assist force in the normal state, and the assist force is further decreased at the electric angle which falls within the predetermined range. When such a phenomenon is induced, a driver of a vehicle may feel discomfort in manipulating the steering wheel.

Next, the description is made with respect to the manner of controlling the first inverter unit 20 and the second inverter unit 30 by the control unit 70 when the ON failure occurred in one of the FETs (abnormal state).

Figure 8A:
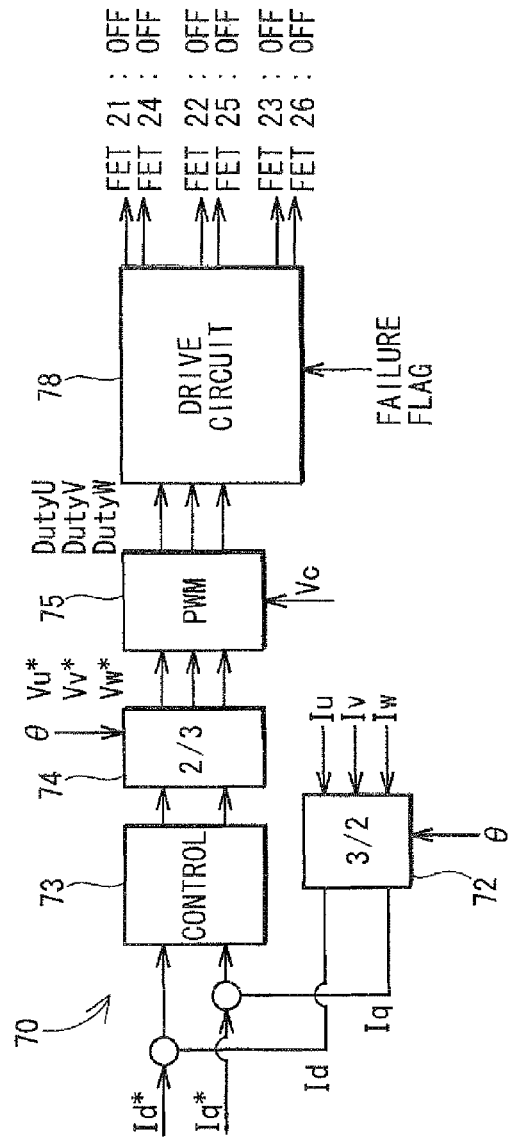
Figure 8B:
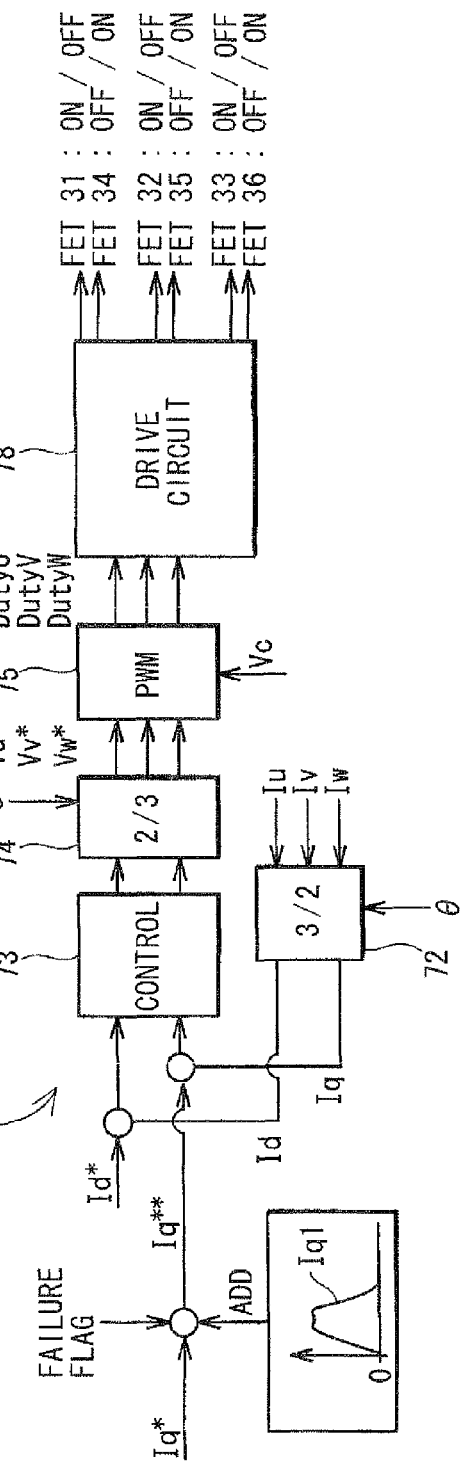

FIG. 8A is a diagram showing a control of a failure system (first inverter unit 20) by the control unit 70, and FIG. 8B is a diagram showing a control of the ON failure system (second inverter unit 30) by the control unit 70.

As shown in FIG. 8A, when the ON failure occurred in the U high-side FET 21, for example, a failure flag (described later) indicative of the occurrence of a failure in one of the FETs (U high-side FET 21) is inputted to the drive circuit 78. When the failure flag is inputted, the drive circuit 78 performs a control such that all of the FETs 21 to 26 in the first inverter unit 20 are brought into the OFF state. That is, the control unit 70 stops the driving of the motor 10 by the first inverter unit 20. Due to such an operation, although the FETs 22 to 26 assume the OFF state, the ON failure still remains in the U high-side FET 21 so that the U high-side FET 21 is held in the ON state.

On the other hand, as shown in FIG. 8B, when the failure flag is inputted to the control unit 70, the control unit 70 adds the current Iq1 to the q-axis command current Iq* to form the corrected q-axis command current Iq and controls the second inverter unit 30 based on the corrected q-axis command current Iq. Here, a waveform of the current Iq1 exhibits a shape corresponding to a waveform which is obtained by reversing positive and negative polarities of the torque of the current Tq1 (torque including the brake torque) shown in FIG. 7A, for example. A value of the current Iq1 may be calculated by an arithmetic operation or may be held in a map for every rotational speed of the motor 10.

When the control unit 70 performs the ON/OFF control of the FETs 31 to 36 of the second inverter unit 30 based on the d-axis command current Id* and the corrected q-axis command current Iq**, the output torque Tq2 of the motor 10 generated by the second inverter unit 30 (second system) takes a value shown in FIG. 9A. The output torque Tq of the motor 10 as a whole at this time is the sum of the torque Tq1 generated by the first system (FIG. 7A) and the torque Tq2 generated by the second system (FIG. 9A), and takes the value shown in FIG. 9B.

As shown in FIG. 9B, when the control is performed, although the driving of the motor 10 by the first system is stopped, the output torque Tq of the motor 10 as a whole becomes 50% of the total torque in the normal state and is maintained at the fixed value. That is, when the control is not performed, the output torque Tq of the motor 10 as a whole is influenced by a brake torque which is generated in the failure system (first system) and, hence, the output torque Tq of the motor 10 as a whole is decreased at an electric angle within a predetermined range (FIG. 7B). To the contrary, in this embodiment, since the FETs of the non-failure system (second system) are controlled such that the brake torque is cancelled, the output torque Tq of the motor 10 as a whole can be set to the fixed value at any electric angle (FIG. 9B). Due to such a configuration, even when a failure occurred in either one of the first system and the second system, the output torque of the motor 10 can be made stable.

Here, the brake torque is generated in the motor 10 when a failure occurred in any one of the FETs 21 to 26 and 31 to 36. However, the control unit 70 performs the unique control of the FETs in the non-failure system so as to cancel the brake torque and, hence, the output torque of the motor 10 as a whole can be set to the fixed value at any electric angle.

Next, the manner of determining the presence or non-presence of the occurrence of the short-circuiting failure by the control unit 70 and the manner of specifying the failure FET, in which the ON failure occurred, performed by the control unit 70 are described in detail.

Firstly, the manner of determining the presence or non-presence of the occurrence of the short-circuiting failure by the control unit 70 is described. The control unit 70 determines whether a short-circuiting failure occurred in any one of the phases of the first system and the second system based on detection values of the current detection parts 41 to 46 (FIG. 1).

Usually (in the case where the ON failure does not occur in any of the FETs), the control unit 70 performs a control such that either one of two FETs (high-side FET and low-side FET) of the same leg is turned off without fail. Accordingly, a current having a value smaller than a predetermined value flows in the current detection parts 41 to 46. However, when the ON failure occurred in the U high-side FET 21 in the first system, for example, the current of the predetermined value or more flows in the current detection part 41 at timing that the U low-side FET 24 assumes the ON state. On the other hand, when the ON failure occurred in the U low-side FET 24, the current of the predetermined value or more flows in the current detection part 41 at timing that the U high-side FET 21 assumes the ON state. Accordingly, when the current detection part 41 detects the current value of the predetermined value or more, the control unit 70 determines that the short-circuiting failure occurred in the U-phase of the first system. In the same manner as described above, when the ON failure occurred in the V high-side FET 22 (V low-side FET 25) or when the ON failure occurred in the W high-side FET 23 (V low-side FET 26), for example, the control unit 70 can determine that the short-circuiting failure occurred in the V-phase of the first system or the W-phase of the first system based on the detection value of the current detection part 42 or the current detection part 43.

In the same manner as described above, when the ON failure occurred in one of the U high-side FET 31 (U low-side FET 34), the V high-side FET 32 (V low-side FET 35) and the W high-side FET 33 (W low-side FET 36) of the second system, the current having the predetermined value or more flows in the current detection part 44, the current detection part 45 or the current detection part 46. Accordingly, the control unit 70 can determine that the short-circuiting failure occurred in one of the U-phase of the second system, the V-phase of the second system and the W-phase of the second system based on the detection values of the current detection parts 44 to 46.

Subsequently, the manner of specifying the FET in which the ON failure occurred performed by the control unit 70 is described. The control unit 70 specifies the FET in which the ON failure occurred out of the FETs 21 to 26 or the FETs 31 to 36 based on values of terminal voltages of the respective phases of the respective systems, that is, detection values of the voltage detection parts 51 to 56 (FIG. 1).

Usually (in the case where the ON failure occurred none of the FETs), in a state where the control unit 70 stops the PWM control, the detection values of the respective voltage detection parts 51 to 56 indicate a voltage value (VPIG/2) which is one half of the power source voltage value VPIG. However, when the ON failure occurred in the U high-side FET 21 in the first system, for example, in a state where the control unit 70 stops the PWM control, the detection value of the voltage detection part 51 becomes substantially equal to the power source voltage value VPIG. Accordingly, when the detection value of the voltage detection part 51 is substantially equal to the power source voltage value VPIG, the control unit 70 determines that the ON failure occurred in the U high-side FET 21. On the other hand, when the ON failure occurred in the U low-side FET 24 in the first system, in a state where the control unit 70 stops the PWM control, the detection value of the voltage detection part 51 becomes substantially equal to the ground voltage value GND. Accordingly, when the detection value of the voltage detection part 51 is substantially equal to the ground voltage value GND, the control unit 70 determines that the ON failure occurred in the U low-side FET 24.

In the same manner as described above, for example, when the detection value of the voltage detection part 52 is substantially equal to the power source voltage value VPIG, the control unit 70 determines that the ON failure occurred in the V high-side FET 22, while when the detection value of the voltage detection part 52 is substantially equal to the ground voltage value GND, the control unit 70 determines that the ON failure occurred in the V low-side FET 25.

In this manner, in a state where the control unit 70 stops the PWM control, when the detection value of one of the voltage detection parts 51 to 56 is substantially equal to the power source voltage value VPIG or the ground voltage value GND, the control unit 70 can specify the FET having the ON failure based on the detection value. The relationship between the detection value of one of the voltage detection parts 51 to 56 and the FET having the ON failure and which is specified based on the detection value is preset in the memory as indicated in a table shown in FIG. 10.

Figure 11:
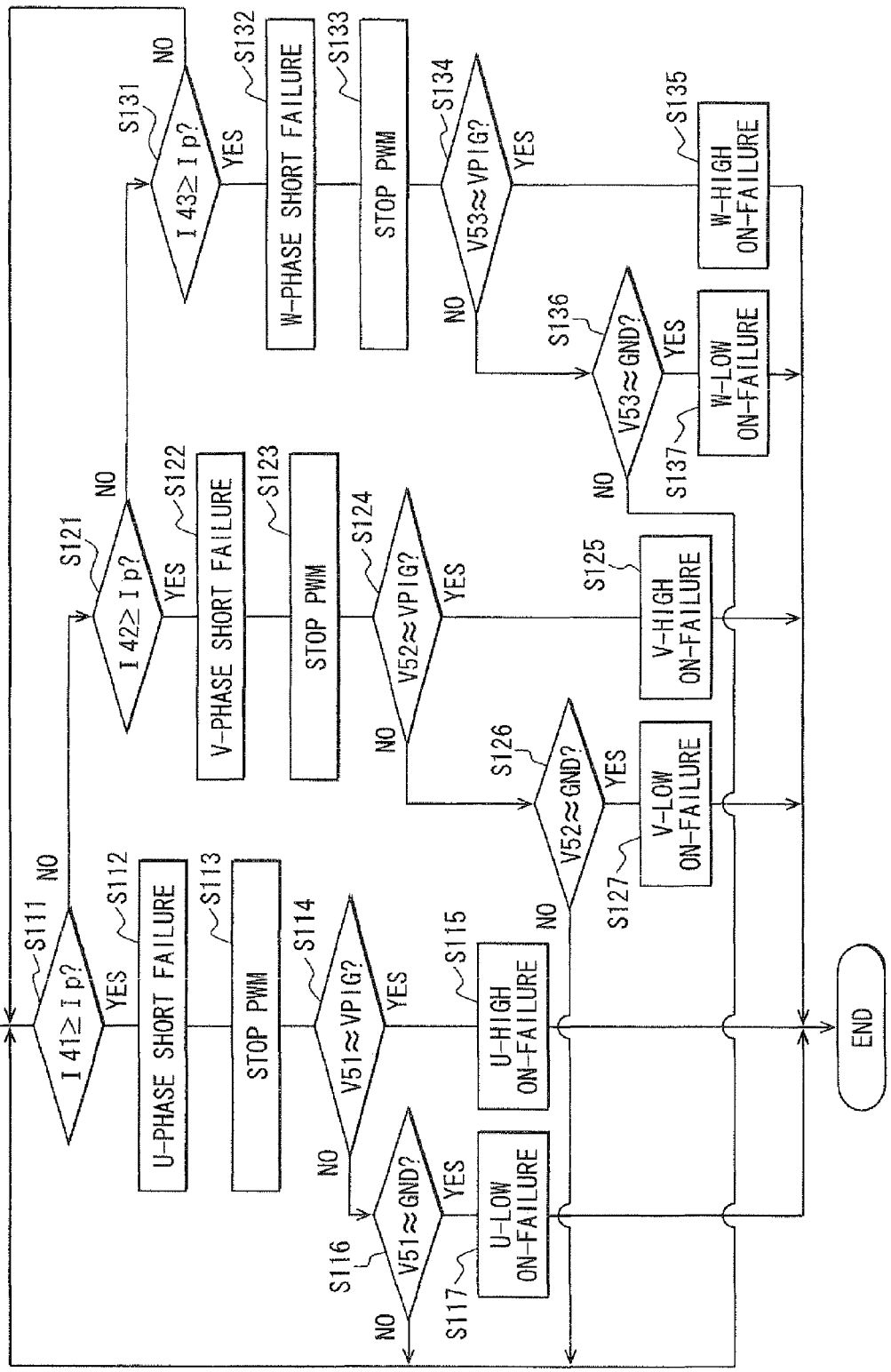
FIG. 11 is a flowchart showing processing relating to "the determination of presence or non-presence of the occurrence of the short-circuiting failure" and "the specification of a failure switching element" which the control apparatus according to the first embodiment performs.

Next, the processing relating to the determination of presence or non-presence of the occurrence of the short-circuiting failure and the specification of FET in which the ON failure occurred by the control unit 70 is described in reference to FIG. 11, which is executed with respect to each of the first system (inverter unit 20) and the second system (inverter unit 30).

As shown in FIG. 11, the processing starts when the driving of the vehicle starts, that is, when a driver turns on an ignition key of the vehicle, for example.

When the processing starts, firstly, the control unit 70 executes the processing at step 111 (step is simply referred to as S).

At S111, the control unit 70 determines whether the current detection value of the U-phase, that is, a detection value 141 or 144 of the current detection part 41 or the current detection part 44 (FIG. 1) is equal to the predetermined value or more. When the control unit 70 determines that the current detection value 141 or 144 of the U-phase is equal to the predetermined value Ip or more (S111: YES), the processing proceeds to S112. On the other hand, when the control unit 70 determines that the current detection value 141 or 144 of the U-phase is not equal to the predetermined Ip or more (S111: NO), the processing proceeds to S121.

The control unit 70 determines at S112 that the short-circuiting failure occurred in the U-phase of the first system or the second system based on the detection value 141 or 144 of the current detection part 41 or the current detection part 44 detected at S111. After S112, the processing proceeds to S113

The control unit 70 stops the PWM control of the system, in which the short-circuiting failure occurred, at S113. After S113, the processing proceeds to S114.

The control unit 70 determines at S114 whether the terminal voltage of the U-phase in the system in which the short-circuiting failure occurred, that is, the detection value V51 or V54 of the voltage detection part 51 or the voltage detection part 54 is substantially equal to the power source voltage VPIG. When the control unit 70 determines that the terminal voltage of the U-phase in the system where the short-circuiting failure occurred is substantially equal to the power source voltage VPIG (S114: YES), the processing proceeds to S115. On the other hand, when the control unit 70 determines that the terminal voltage of the U-phase in the system where the short-circuiting failure occurred is not substantially equal to the power source voltage VPIG (S114: NO), the processing proceeds to S116.

The control unit 70 determines at S115 that the ON failure occurred in the high-side FET of the U-phase. That is, the control unit 70 specifies the U high-side FET 21 or the U high-side FET 31 as the FET, in which the ON failure occurred, based on the detection value V51 or V54 of the voltage detection part 51 or the voltage detection part 54 detected at S114. Here, the control unit 70 stores information on the FET in which the ON failure occurred (U high-side FET 21 or the U high-side FET 31) in the memory as a value of the failure flag. When the FET in which the ON failure occurred is specified at S115, the control unit 70 finishes the series of processing shown in FIG. 11.

The control unit 70 determines at S116 whether the terminal voltage of the U-phase in the system where the short-circuiting failure occurred, that is, the detection value of the voltage detection part 51 or the voltage detection part 54 is substantially equal to the ground voltage GND. When the control unit 70 determines that the terminal voltage of the U-phase in the system where the short-circuiting failure occurred is substantially equal to the ground voltage GND (S116: YES), the processing proceeds to S117. On the other hand, when the control unit 70 determines that the terminal voltage of the U-phase in the system in which the short-circuiting failure occurred is not substantially equal to the ground voltage GND (S116: NO), the processing returns to S111.

The control unit 70 determines at S117 that the ON failure occurred in the low-side FET of the U-phase. That is, the control unit 70 specifies the U low-side FET 24 or the U low-side FET 34 as the FET, in which the ON failure occurred, based on the detection value V51 or V54 of the voltage detection part 51 or the voltage detection part 54 detected at S116. Here, the control unit 70 stores information on the FET in which the ON failure occurred (U low-side FET 24 or the U low-side FET 34) in the memory as a value of the failure flag. When the control unit 70 specifies the FET in which the ON failure occurred at S117, the control unit 70 finishes the series of processing shown in FIG. 11.

The control unit 70 determines at S121 whether the current detection value of the V-phase, that is, the detection value 142 or 145 of the current detection part 42 or the current detection part 45 (FIG. 1) is equal to the predetermined value Ip or more. When the control unit 70 determines that the current detection value of the V-phase is equal to the predetermined value or more (S121: YES), the processing proceeds to S122. On the other hand, when the control unit 70 determines that the current detection value of the V-phase is not equal to the predetermined value or more (S121: NO), the processing proceeds to S131.

Processing at S122 to S127 is substantially similar to the processing at S112 to S117 described above and, hence, further similar description is omitted. Here, when the control unit 70 specifies the FET in which the ON failure occurred (V high-side FET or the V low-side FET) at S125 or S127, the control unit 70 finishes the series of processing shown in FIG. 11.

The control unit 70 determines at S131 whether the current detection value of the W-phase, that is, the detection value 143 or 153 of the current detection part 43 or the current detection part 46 (FIG. 1) is equal to the predetermined value Ip or more. When the control unit 70 determines that the current detection value of the W-phase is equal to the predetermined value or more (S131: YES), the processing proceeds to S132. On the other hand, when the control unit 70 determines that the current detection value of the W-phase is not equal to the predetermined value or more (S131: NO), the processing returns to S111.

Processing at S132 to S137 is substantially similar to the processing at S112 to S117 described above and, hence, further similar description is omitted. Here, when the FET in which the ON failure occurred (W high-side FET or the W low-side FET) is specified at S135 or S137, the control unit 70 finishes the series of processing shown in FIG. 11.

In this manner, the control unit 70 performs the determination of system and the phase in which the short-circuiting failure occurred, that is, the determination of presence or non-presence of the occurrence of the short-circuiting failure at S111, S112, S121, S122, S131 and S132, and performs the determination of FET in which the ON failure occurred, that is, the specification of FET in which the ON failure occurred at S113 to S117, S123 to S127 and S133 to S137.

As described above, the control unit 70 performs the control such that, when the short-circuiting failure occurred in either one of the first inverter unit 20 (first system) or the second inverter unit 30 (second system), all FETs in the system in which the short-circuiting failure occurred (FETs 21 to 26 or FETs 31 to 36) assume the OFF state. Due to such a control, out of the plurality of FETs in the failure system, the FETs other than the FET in which the ON failure occurred assume the OFF state. That is, at this time, the control unit 70 stops the driving of the motor 10 by the failure system and continues the driving of the motor 10 by the non-failure system. Here, at this time, in the failure system, along with the occurrence of the short-circuiting failure, the output (brake torque) which resists the driving of the motor 10 is generated. Accordingly, at this time, the control unit 70 controls the FETs in the non-failure system so as to cancel the brake torque generated in the failure system or to decrease the influence of the brake torque exerted on the driving of the motor 10.

When the short-circuiting failure occurred, the output torque of the motor 10 as a whole becomes approximately half (50%) of the output torque, which is provided in the normal state. However, due to the control, the pulsation of the output torque of the motor 10 caused by the brake torque can be suppressed. As a result, the output torque of the motor 10 can be set to the fixed value. In this manner, when the ON failure occurred in one of the FETs, the control apparatus 1 suppresses the influence of the brake torque which is generated in the failure system exerted on the driving of the motor 10 as much as possible so that the stable driving of the motor 10 can be continued. Accordingly, discomfort which a driver perceives from the electric power steering system which uses the motor 10 in manipulating a steering wheel when the short-circuiting failure occurred can be reduced. Further, even when the short-circuiting failure where the winding of the motor 10 and the common bus line for the respective FETs are short-circuited with each other occurs, discomfort which the driver perceives in manipulating a steering wheel when the failure occurred can be reduced in the same manner as described above.

Further, the control apparatus 1 is provided with the current detection parts 41 to 46 which can detect currents which flow in the respective phases of the plurality of winding sets (first winding set 18 or second winding set 19). The control unit 70 performs the determination of presence or non-presence of the occurrence of the short-circuiting failure based on the current detection values detected by the current detection parts 41 to 46. Due to such a configuration, the control unit 70 can determine the presence or non-presence of the occurrence of the short-circuiting failure with high accuracy.

Further, the control apparatus is provided with the voltage detection parts 51 to 56 which can detect voltages of the respective phases of the plurality of winding sets (first winding set 18 or second winding set 19). The control unit 70 performs the specification of of the failure switching element based on the voltage detection values detected by the voltage detection parts 51 to 56 when the PWM control is stopped. Due to such a configuration, the control unit 70 can specify the switching element in which the ON failure occurred with high accuracy.

Second Embodiment

The control apparatus 1 according to the second embodiment partially differs from the first embodiment with respect to the manner of controlling the non-failure system by the control unit 70 after the short-circuiting failure occurred.

Figure 12:
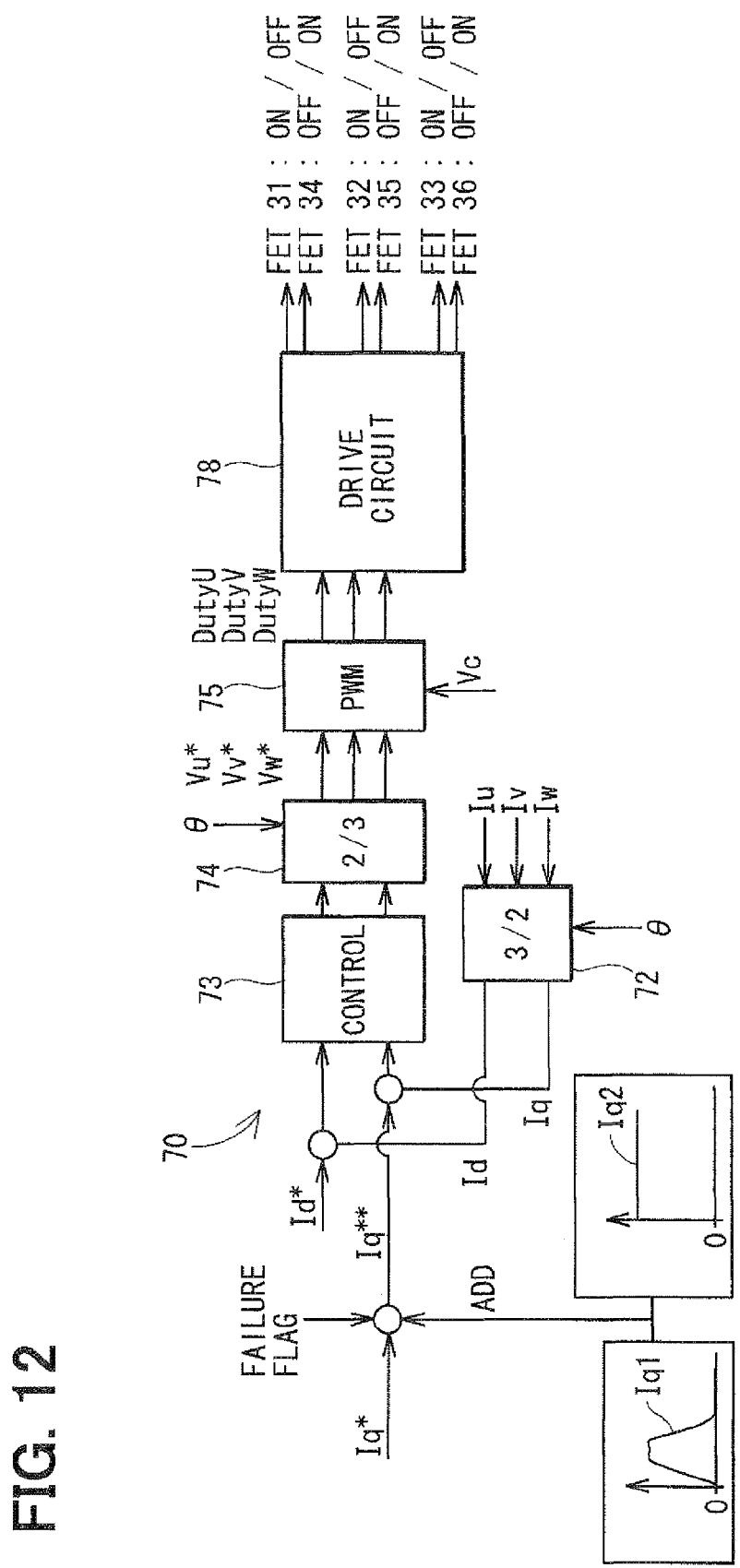
FIG. 12 is a block diagram showing a control by a control apparatus according to a second embodiment of the present invention in an abnormal state and showing a control unit which controls the ON failure system.

In the first embodiment, when the short-circuiting failure occurred because of the occurrence of the ON failure in the U high-side FET 21, for example, the control unit 70, upon inputting of the failure flag to the control unit 70, adds the current Iq1 to the q-axis command current Iq* to form the corrected q-axis command current Iq and controls the second inverter unit 30 based on the corrected q-axis command current Iq (FIG. 8B). To the contrary, as shown in FIG. 12, the second embodiment is characterized in that, when the short-circuiting failure occurred, the control unit 70, upon inputting of the failure flag to the control unit 70, adds the current Iq1 and the current Iq2 to the q-axis command current Iq* to form the corrected q-axis command current Iq, and controls the second inverter unit 30 based on the corrected q-axis command current Iq. A waveform of the current Iq2 is substantially equal to the waveform of the q-axis command current Iq*. Here, the corrected q-axis command current Iq** is also referred to as a value, which is obtained by adding the current Iq1 to a value which is twice as large as the q-axis command current Iq*.

Figure 13A:
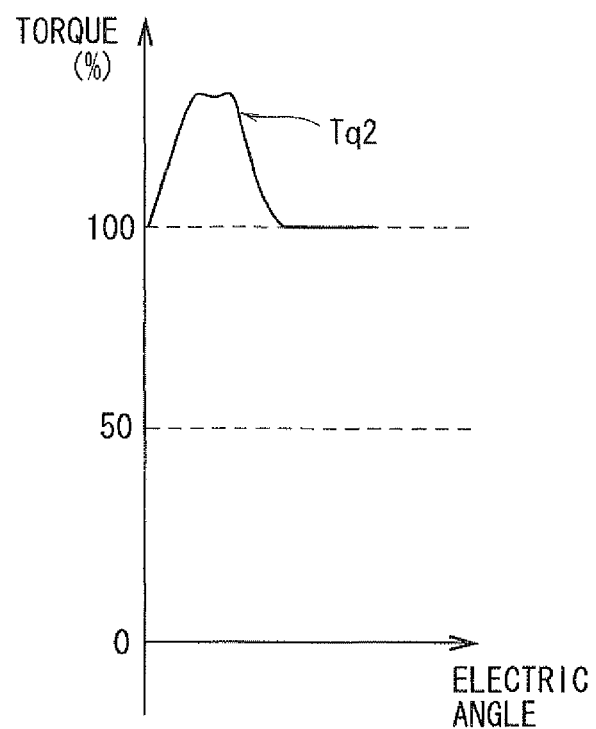

In this embodiment, when the control unit 70 performs the ON/OFF control of FETs 31 to 36 in the second inverter unit 30 based on the d-axis command current Id* and the corrected q-axis command current Iq**, the output torque Tq2 of the motor 10 generated by the second inverter unit 30 (second system) takes a value shown in FIG. 13A. The output torque Tq of the motor 10 as a whole at this time is a sum of the torque Tq1 (FIG. 7A) generated by the first system and the torque Tq2 (FIG. 13A) generated by the second system, and takes a value shown in FIG. 13B.

Figure 13B:
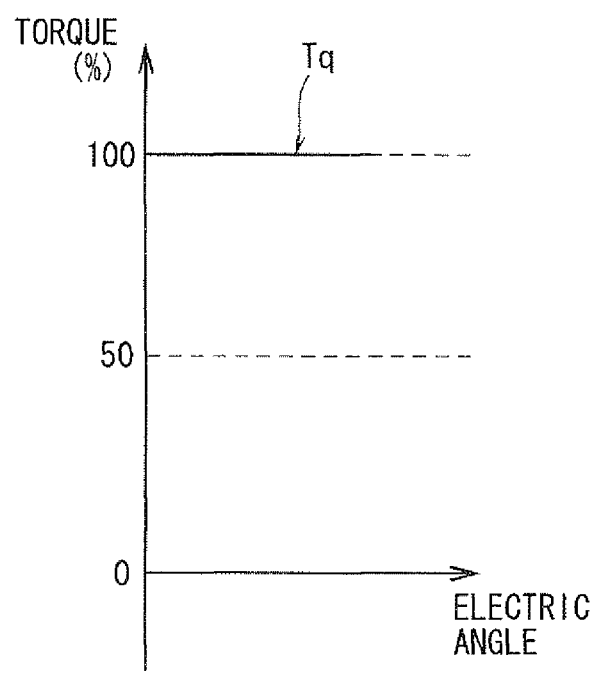

As shown in FIG. 13B, when the control is performed, the output torque Tq of the motor 10 as a whole is 100% of the torque in the normal state and is maintained at the fixed value although the driving of the motor 10 by the first system is stopped. That is, in this embodiment, the control unit 70 controls the non-failure system (second system) such that the torque which cancels the brake torque generated in the failure system (first system)" and the torque which is to be outputted from the failure system (first system) originally (normal state) are outputted.

As described above, although the load applied to the non-failure system is increased when the short-circuiting failure occurred, the output torque of the motor 10 as a whole can be made substantially equal to the output torque in the normal state (100%) and can be set to the fixed value. Accordingly, discomfort which a driver perceives from the electric power steering system which uses the motor 10 in manipulating the steering wheel when the short-circuiting failure occurred can be further reduced. Further, even when the short-circuiting failure in which the winding of the motor 10 and the common bus line for respective FETs are short-circuited occurs, discomfort which a driver perceives in manipulating the steering wheel when the short-circuiting failure occurred can be reduced in the same manner as described above.

Third Embodiment

The control apparatus 1 according to the third embodiment differs from the first embodiment with respect to the manner of controlling the failure system and the manner of controlling the non-failure system by the control unit 70 after the short-circuiting failure occurred.

In the first embodiment, when the control unit 70 determines that the ON failure occurred in one of the FETs 21 to 26, 31 to 36, the control unit 70 performs a control such that all FETs (FETs 21 to 26 or the FETs 31 to 36) in the system (first system or second system) which includes the failure FET are brought into the OFF state, and stops the driving of the motor 10 by the failure system including the failure FET. To the contrary, the third embodiment is characterized in that, when the control unit 70 determines that the ON failure occurred in one of the FETs 21 to 26, 31 to 36, the control unit 70 performs a control such that the driving of the motor 10 is continued also by the failure system, which includes the failure FET, in addition to the driving of the motor 10 by the non-failure system.

Firstly, the description is made with respect to the torque which is outputted from the failure system, which includes the failure FET, when the ON failure occurred in one of FETs 21 to 26 and 31 to 36 and the control unit 70 attempts to control the failure system in the same manner as the control performed in the usual time (normal state).

Figure 14A:
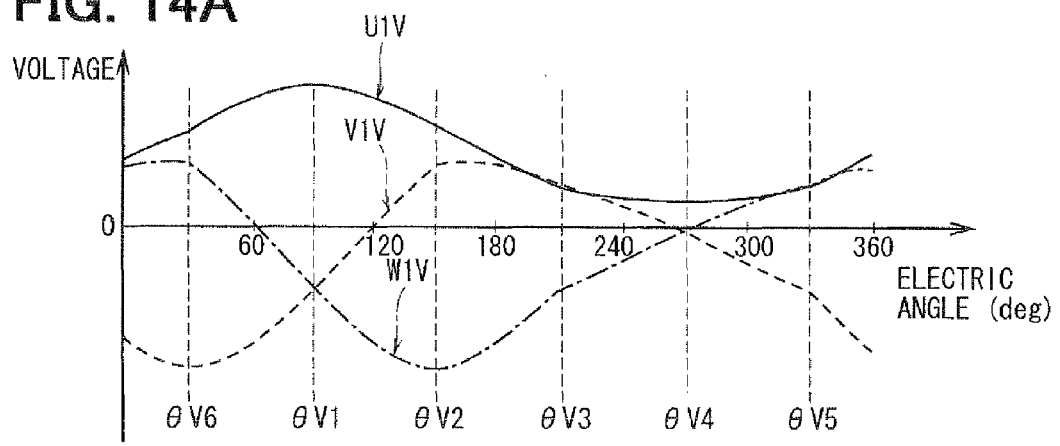

For example, when the ON failure occurred in the U high-side FET 21, the U high-side FET 21 is always held in the ON state. Accordingly, the first inverter unit 20 cannot output voltage vectors V0, V3, V4 and V5 out of voltage vectors (V0 to V7) shown in FIGS. 4A to 4H. Accordingly, when the ON/OFF control of the FETs 21 to 26 in the first inverter unit 20 is performed such that the voltage vectors are changed in the same manner as the vectors in the usual time (normal state) in the state where the ON failure occurred in the U high-side FET 21, voltages (U1V, V1V, W1V) shown in FIG. 14A are respectively applied to coils (U1 coil 11, V1 coil 12, W1 coil 13) of respective phases (U-phase, V-phase, W-phase). To compare the voltage waveform shown in FIG. 14A with the voltage waveform in the normal state (FIG. 5A), it is understood that these voltage waveforms largely differ from each other particularly when the electric angle is θV3 (210 deg), θV4 (270 deg) and θV5 (330 deg). This is because even when the control unit 70 attempts to control the first inverter unit 20 such that the voltage vectors V3, V4 and V5 are outputted, the first inverter unit 20 cannot output the voltage vectors V3, V4 and V5. Further, in the state where the ON failure occurred in the U high-side FET 21, the voltage vector V0 cannot be outputted even at the electric angle where the voltage vector is to be set to V0 originally (normal state) and, hence, the voltage value at this time differs from the voltage value in the normal state.

Figure 14B:
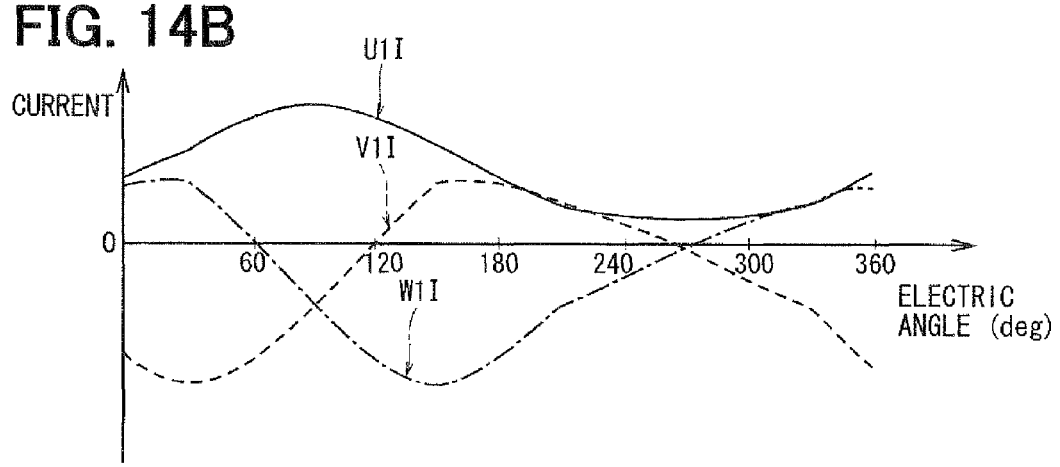
Figure 14C:
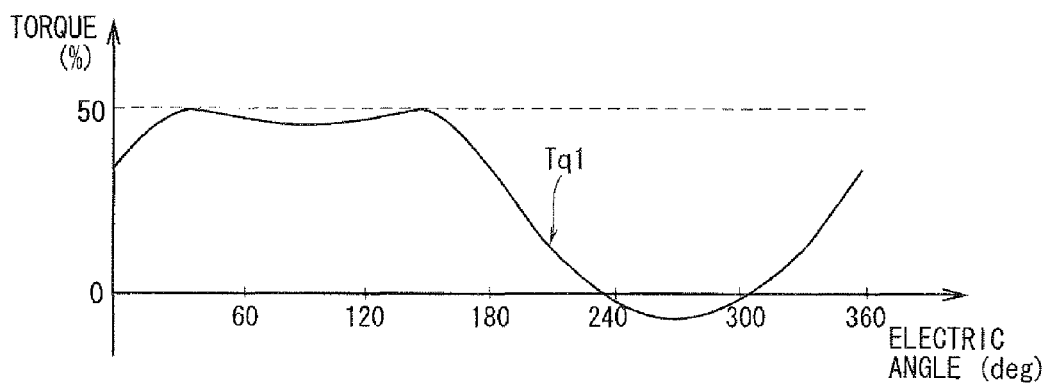

When the voltages shown in FIG. 14A are applied to the coils of the respective phases, currents (U1I, V1I, W1I) corresponding to the applied voltages flow in the respective coils (U1 coil 11, V1 coil 12, W1 coil 13) (FIG. 14B). Due to such an operation, the torque Tq1 is generated in the motor 10 by the first inverter unit 20 (first system) as shown in FIG. 14C. Here, FIG. 14A, FIG. 14B and FIG. 14C respectively indicate voltages, currents and a torque when the motor 10 is not rotated, that is, when the induction voltage is not generated in the motor 10.

As shown in FIG. 14C, in an attempt to control the failure system (first system) in the same manner as the usual time (normal state), the torque Tq1 outputted from the failure system becomes smaller than the torque (50%) in the usual time at the electric angle other than approximately 30 degrees or approximately 150 degrees. Further, a negative torque is outputted when the electric angle falls within the range from approximately 240 to 300 degrees.

Accordingly, in this embodiment, for example, when the ON failure occurred in the U high-side FET 21, the control unit 70 controls the FETs of the first inverter unit 20 such that the voltage vector becomes V6 when the electric angle falls within the range from 0 to 30 degrees and within the range from 300 to 360 degrees. Further, the control unit 70 controls the FETs of the first inverter unit 20 such that the voltage vector becomes V2 when the electric angle falls within the range from 150 to 240 degrees. Further, the control unit 70 controls the FETs of the first inverter unit 20 such that the voltage vector becomes V7 or all FETs assume the OFF state when the electric angle falls within the range from 240 to 300 degrees. Further, the control unit 70 controls the FETs of the first inverter unit 20 such that the voltage vector becomes V7 at the electric angle where the usual (normal) voltage vector is controlled to assume V0. That is, the control unit 70 controls the FETs by substituting the voltage vectors (V0, V3, V4, V5) which cannot be outputted with other voltage vectors which can be outputted. Hereinafter, for the sake of convenience, this control is referred to as a voltage vector substitution control.

Figure 15A:
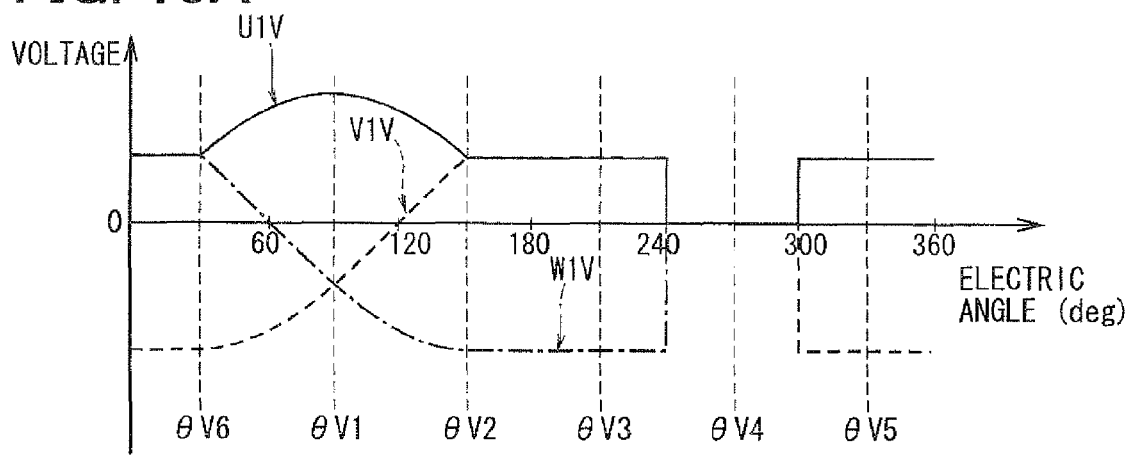

When the ON failure occurred in the U high-side FET 21, in this embodiment, the voltage vector substitution control is performed such that voltages shown in FIG. 15A are applied to the coils of the respective phases in the failure system (first system). Here, it is understood that the voltages (U1V, V1V, W1V) applied to the respective phases are set to the fixed values when the electric angle falls within the range from 0 to 30 degrees and within the range from 150 to 360 degrees.

Figure 15B:
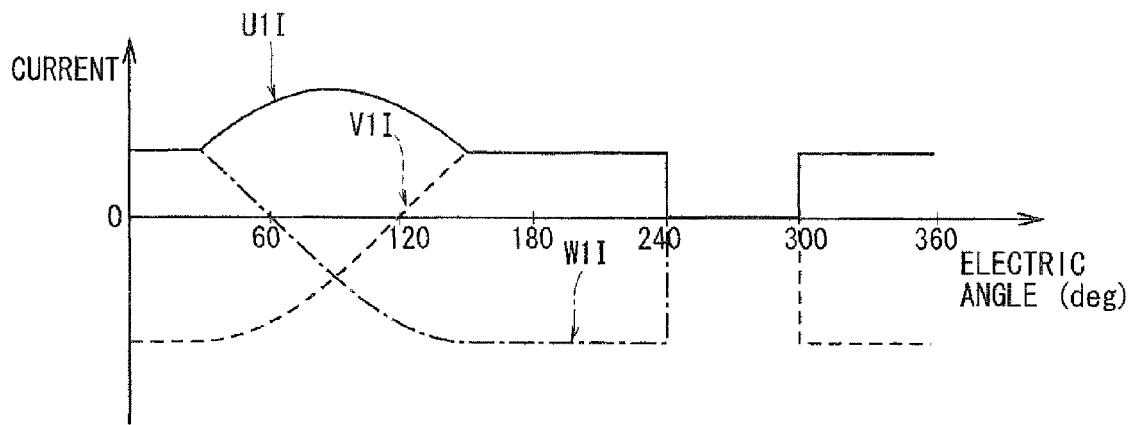

When the voltages (U1V, V1V, W1V) shown in FIG. 15A are applied to the coils of the respective phases, the currents (U1I, V1I, W1I) which correspond to the applied voltages flow in the coils (U1 coil 11, V1 coil 12, W1 coil 13) as shown in FIG. 15B, respectively. Due to such an operation, the torque Tq1 generated by the first inverter unit 20 (first system) is generated in the motor 10 as shown in FIG. 15C.

Here, the output torque when the voltage vector substitution control is not performed (FIG. 14C) and the output torque when the voltage vector substitution control is performed (FIG. 15C) are compared to each other. It is understood that the output torque when the voltage vector substitution control is performed is enhanced as a whole compared to the output torque when the voltage vector substitution control is not performed. Specifically, as shown in FIG. 15C, it is understood that the output torque when the voltage vector substitution control is performed becomes equal to the torque in the normal state (50%) and takes the fixed value when the electric angle falls within the range from 30 to 150 degrees. Hereinafter, this range is referred to as a normal drive interval. Further, it is understood that when the electric angle falls within the range from 0 to 30 degrees, within the range from 150 to 240 degrees and within the range from 300 to 360 degrees, the output torque when the voltage vector substitution control is performed is enhanced compared to the output torque when the voltage vector substitution control is not performed. Hereinafter, this range is referred to as a prolonged drive interval. Here, it is understood that when the electric angle falls within the range from 240 to 300 degrees, the output torque when the voltage vector substitution control is performed takes a fixed value of 0% although the output torque does not take a negative value. Hereinafter, this range is referred to as a prolongation unallowable interval (not prolonged).

Figure 15C:
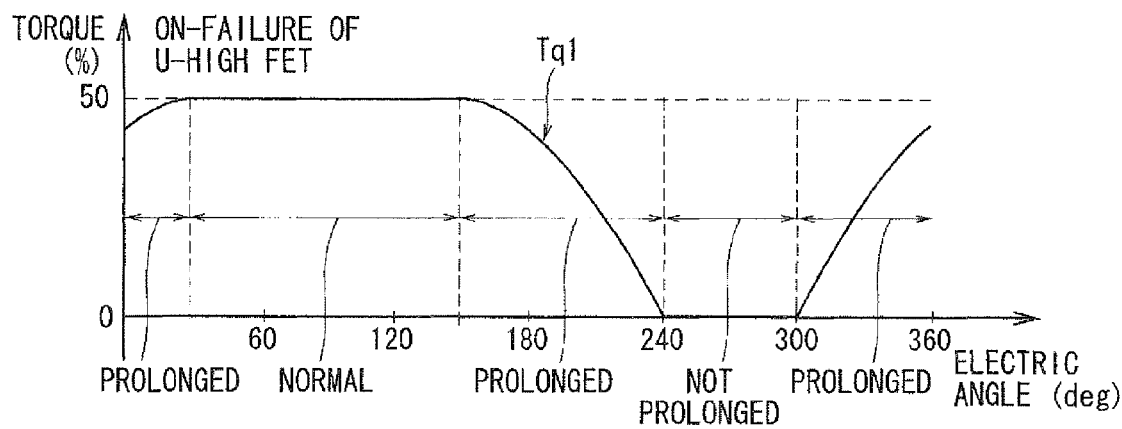
Figure 16A:
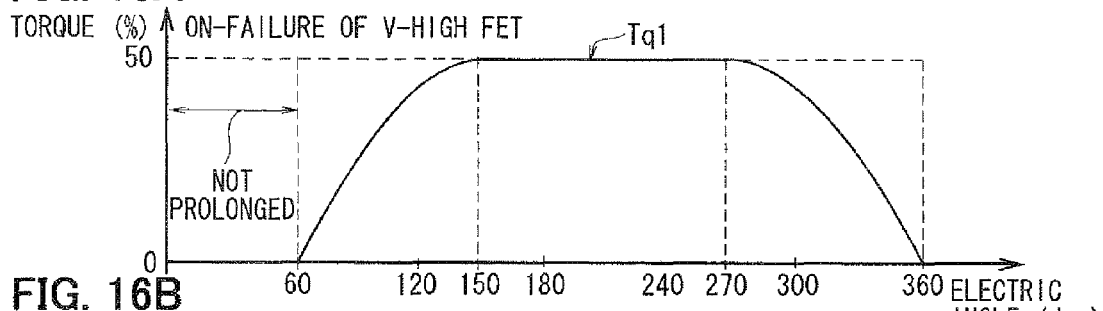
Figure 16B:
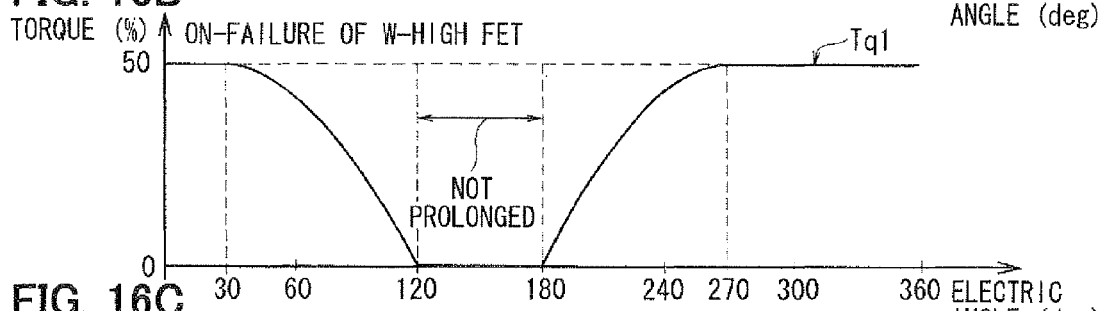
Figure 16C:
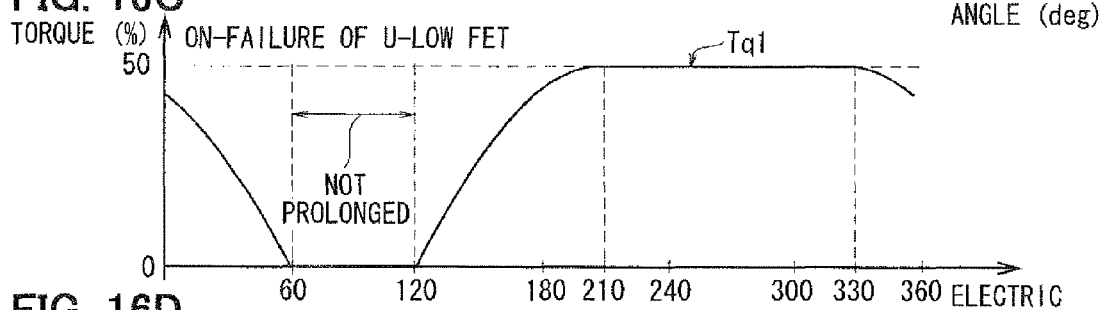
Figure 16D:
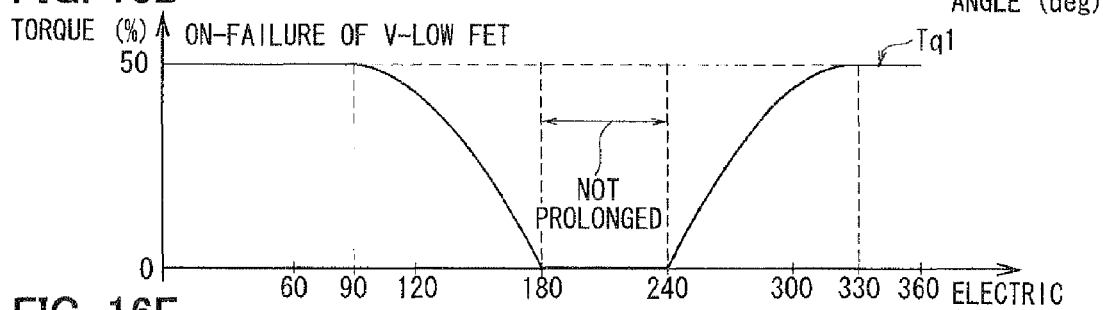
Figure 16E:
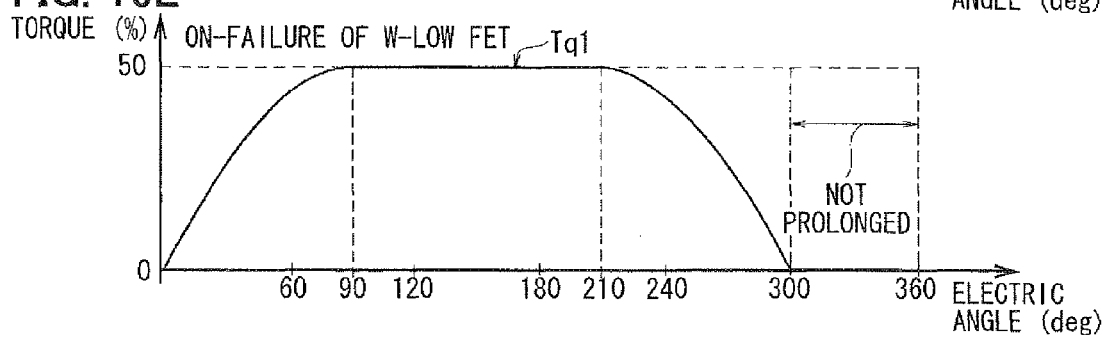

In this manner, when the ON failure occurred in the high-side FET of U-phase, the torque Tq1 which can be outputted by the failure system exactly takes the value shown in FIG. 15C. Here, when the ON failure occurred in the high-side FET of V-phase, the high-side FET of W-phase, the low-side FET of U-phase, the low-side FET of V-phase and the low-side FET of W-phase, the torques Tq1 which can be outputted by the failure system are torques exactly shown in FIG. 16A to FIG. 16E.

The voltage vector substitution control may also be expressed as a control in which, when the driving of the motor 10 is continued by the leg of the non-failure phase out of the legs of the failure system, the FETs of the failure system are controlled for the predetermined period (prolonged drive interval) such that the voltage larger than the voltage in the usual time is applied to the phase which exhibits large degree of contribution to the torque of the motor 10 out of the phases of the failure system. For example, when the ON failure occurred in the U high-side FET 21, within the prolonged drive interval, the phase which exhibits the high degree of contribution to the torque of the motor 10 is the W-phase within the range from 150 to 240 degrees and, hence, the control unit 70 controls the FETs of the failure system such that the (negative) voltage larger than the voltage in the usual time (normal state) is applied to the W-phase within this range (FIG. 15A).

Next, the description is made with respect to the manner of controlling the first inverter unit 20 and the second inverter unit 30 by the control unit 70 when the ON failure occurred in one of the FETs (abnormal state) and when the motor 10 is not rotated (during a period in which the motor 10 is stopped).

Figure 17A:
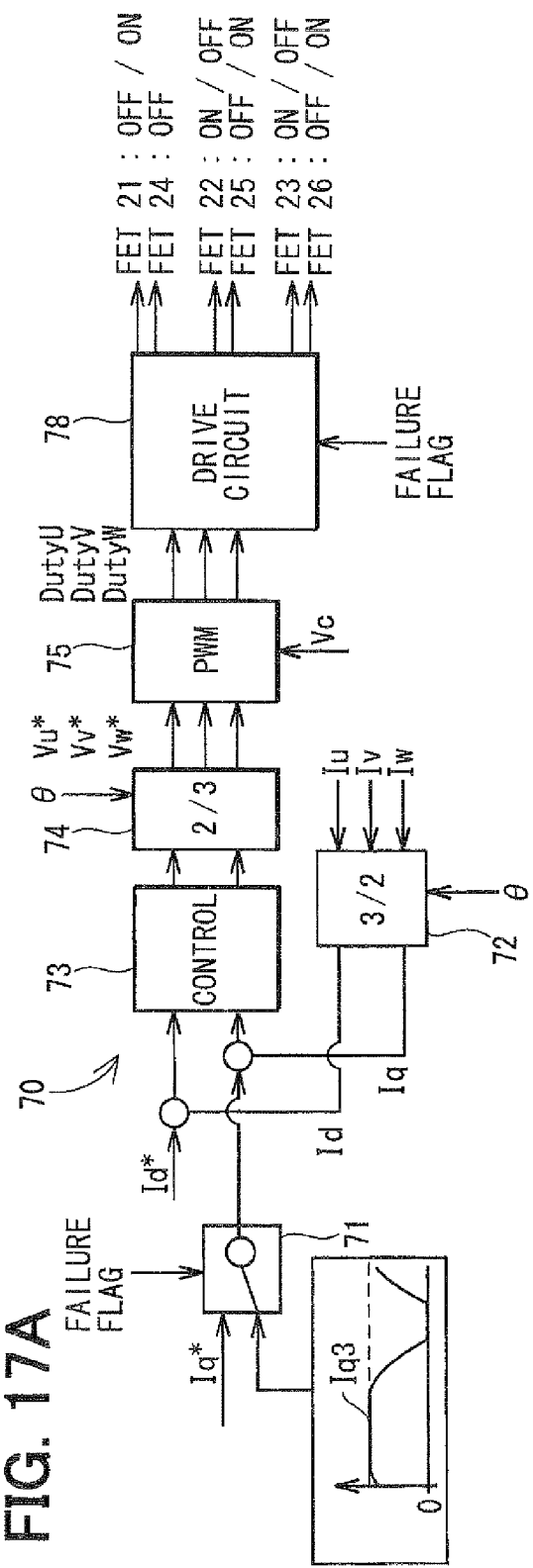
Figure 17B:
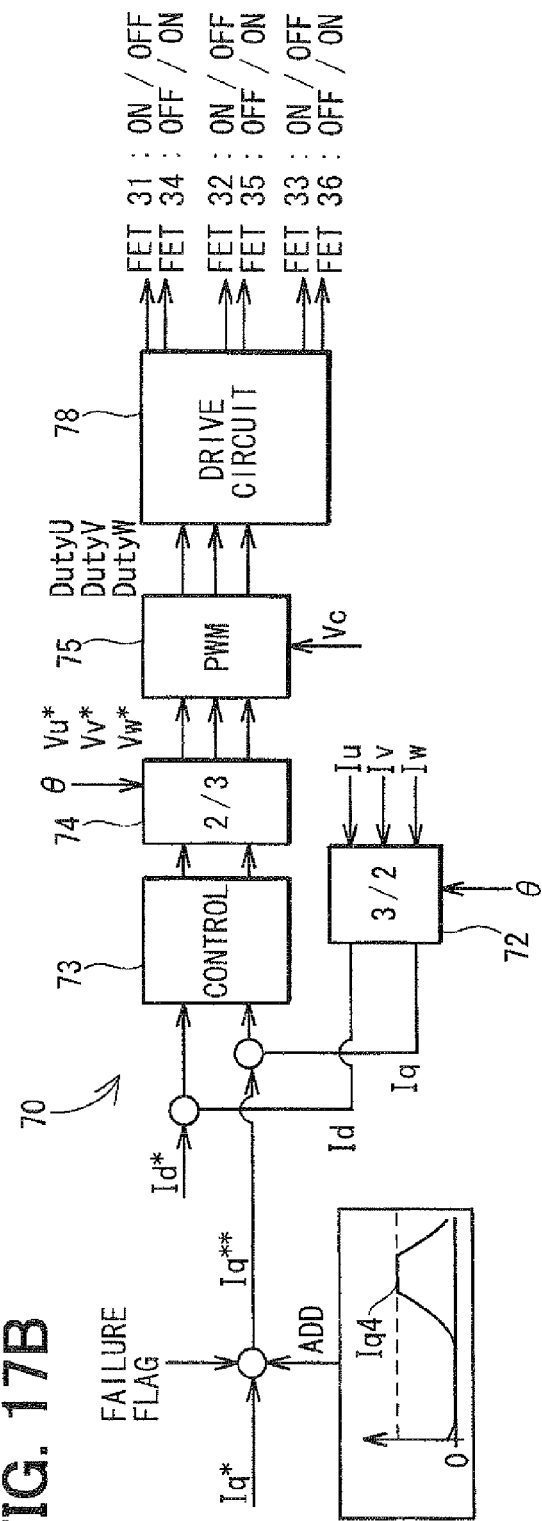

FIG. 17A is a diagram showing a control of the failure system (first inverter unit 20) by the control unit 70, and FIG. 17B is a diagram showing a control of the non-failure system (second inverter unit 30) by the control unit 70.

As shown in FIG. 17A, for example, when the ON failure occurred in the U high-side FET 21, the failure flag indicative of the occurrence of the failure in one of the FET (U high-side FET 21) is inputted to a switch 71. When the failure flag is inputted to the switch 71, the switch 71 changes over an input path such that a current Iq3 is inputted as the q-axis command current Iq*. Here, the current Iq3 is a current of a value which is proportional to a torque value which can be outputted by the failure system (first system) (FIG. 15C). The current Iq3 may be calculated by an arithmetic operation or may be pre-stored in the memory.

Further, when the failure flag is inputted to the drive circuit 78, the drive circuit 78 performs a control such that out of the legs of the first inverter unit 20, both of two FETs (U high-side FET 21 and U low-side FET 24) of the leg (leg 27) of the failure phase (U-phase) or the non-failure FET (U low-side FET 24) assume the OFF state. Due to such a control, the non-failure FET (U low-side FET 24) assumes the OFF state and, hence, it is possible to prevent the leg 27 from assuming the conductive state.

When the control unit 70 performs the ON/OFF control of the FETs 23 to 26 of the first inverter unit 20 based on the d-axis command current Id* and the corrected q-axis command current Iq*, the output torque Tq1 of the motor 10 generated by the first inverter unit 20 (first system) takes the value shown in FIG. 15C.

On the other hand, as shown in FIG. 17B, when the failure flag is inputted to the control unit 70, the control unit 70 adds a current Iq4 to the q-axis command current Iq*, and controls the second inverter unit 30 using the combined current as the corrected q-axis command current Iq**. Here, the value of the current Iq4 is equal to a value which is obtained by subtracting a value of the current Iq3 from a maximum value (fixed value) of the current Iq3. The value of the current Iq4 may be calculated by an arithmetic operation or may be pre-stored in the memory.

Figure 18A:
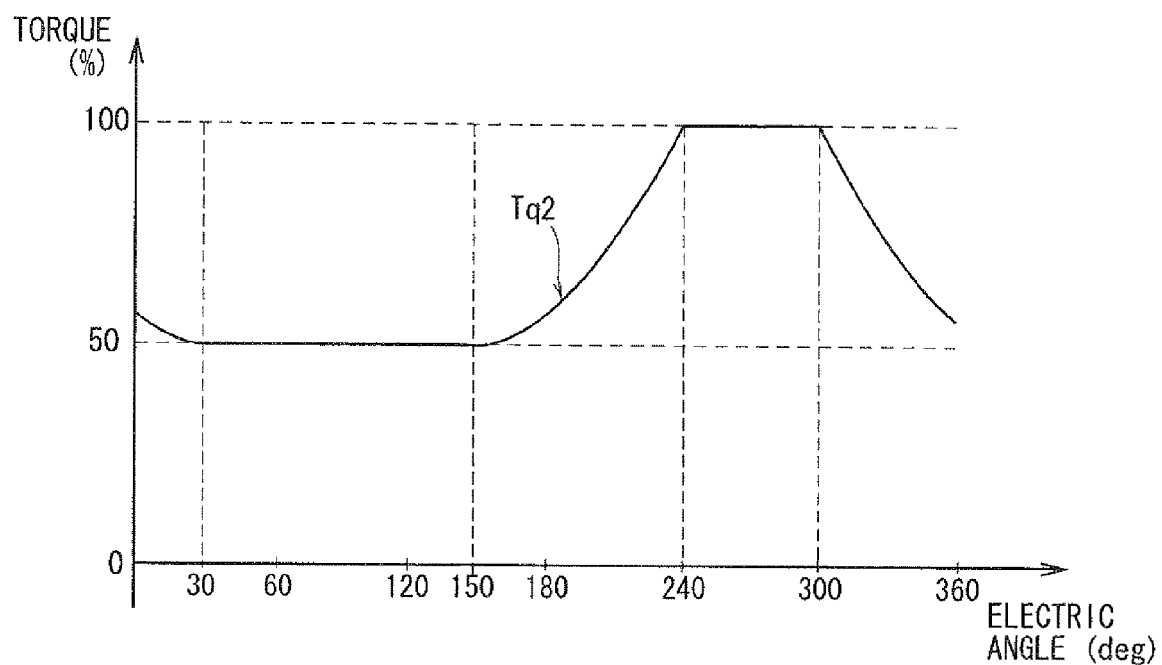

When the control unit 70 performs the ON/OFF control of the FETs 31 to 36 of the second inverter unit 30 based on the d-axis command current Id* and the corrected q-axis command current Iq**, the output torque Tq2 of the motor 10 generated by the second inverter unit 30 (second system) takes a value shown in FIG. 18A. Here, the output torque Tq of the motor 10 as a whole is a sum of the torque Tq1 by the first system (FIG. 15C) and the torque Tq2 by the second system (FIG. 18A) and takes a value shown in FIG. 18B.

Figure 18B:
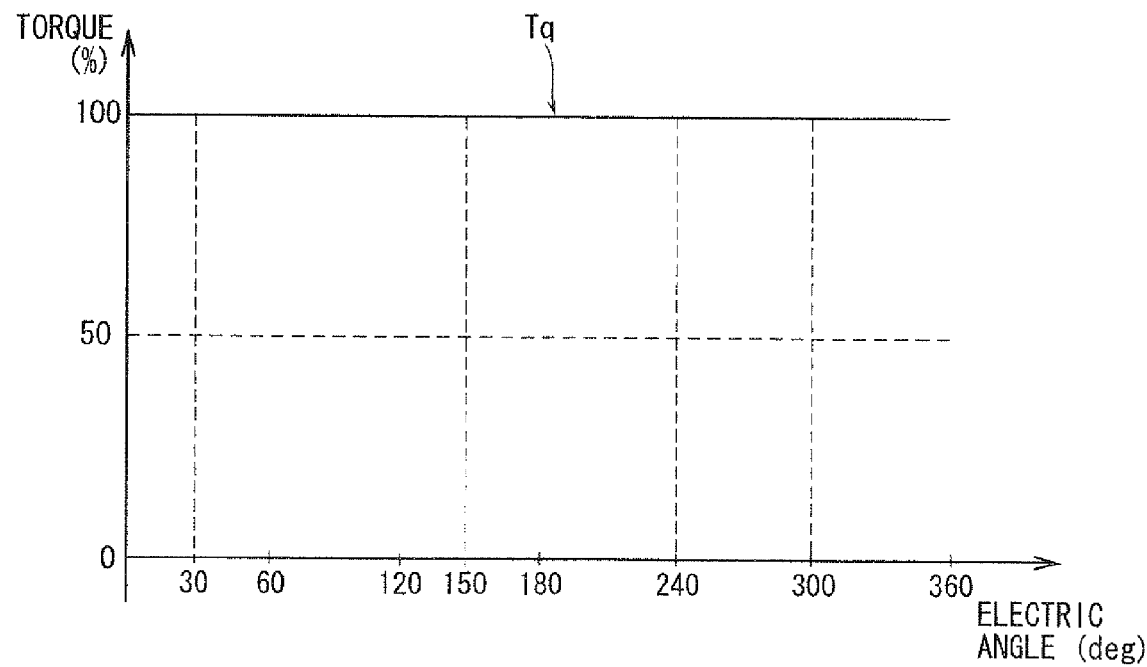

As shown in FIG. 18B, when the control is performed, the output torque Tq of the motor 10 as a whole becomes substantially equal to the output torque in the normal state (100%) and takes the fixed value. In this manner, even when the ON failure occurred in one FET, the driving of the motor 10 by the failure system is continued as much as possible, and the FETs in the non-failure system is controlled so as to cancel the change of the output torque of the failure system. As a result, it is possible to prevent the output torque of the motor 10 as a whole from lowering to a value smaller than the output torque before the occurrence of the failure.

In this embodiment, by changing the values of the current Iq3 and the current Iq4 corresponding to the FETs in which the ON failure occurred (a torque value which can be outputted by the failure system (FIG. 15C, FIG. 16A to FIG. 16E)), the control apparatus can acquire the advantageous effect whichever FET suffers from a failure.

Next, the manner of control of the first inverter unit 20 and the second inverter unit 30 by the control unit 70 of this embodiment when the ON failure occurred in one of the FETs (an abnormal state) and when the motor 10 is rotated is described.

Firstly, the torque which is outputted by the failure system after the voltage vector substitution control is performed when the ON failure occurred in one FET is described with respect to a case where the rotational speed of the motor 10 is low and a case where the rotational speed of the motor 10 is high.

Figure 19A:
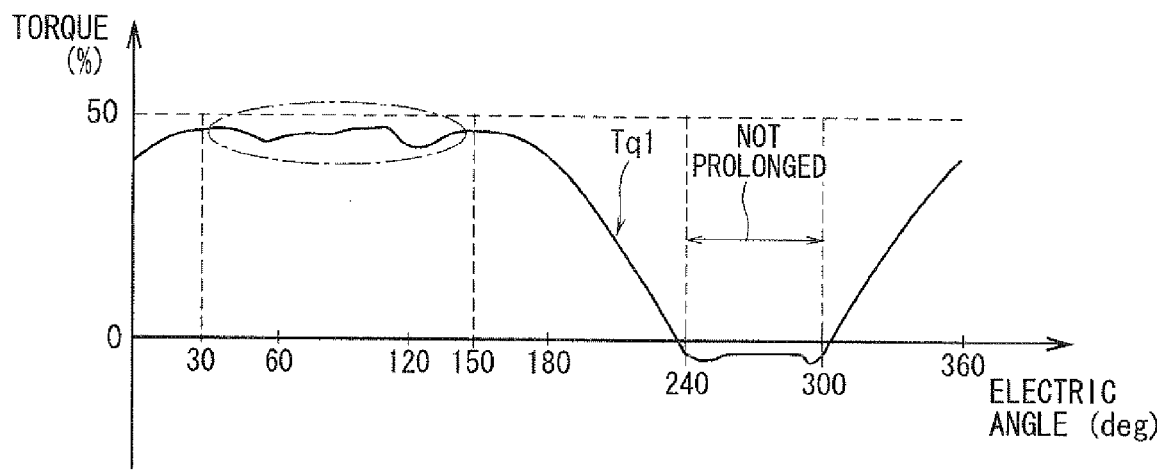

FIG. 19A shows the torque Tq1 which is outputted by the failure system (first system) in the state where the ON failure occurred in the U high-side FET 21 and the motor 10 is rotated at low speeds. When the motor 10 is rotated, the brake torque attributed to the induction voltage is generated in the motor 10. Accordingly, as shown in FIG. 19A, the torque which is outputted by the failure system when the motor 10 is rotated becomes, as a whole, smaller than the torque which can be outputted when the motor 10 is stopped (FIG. 15C). Particularly, a negative torque is generated during the prolongation unallowable interval (not-prolonged).

Figure 19B:
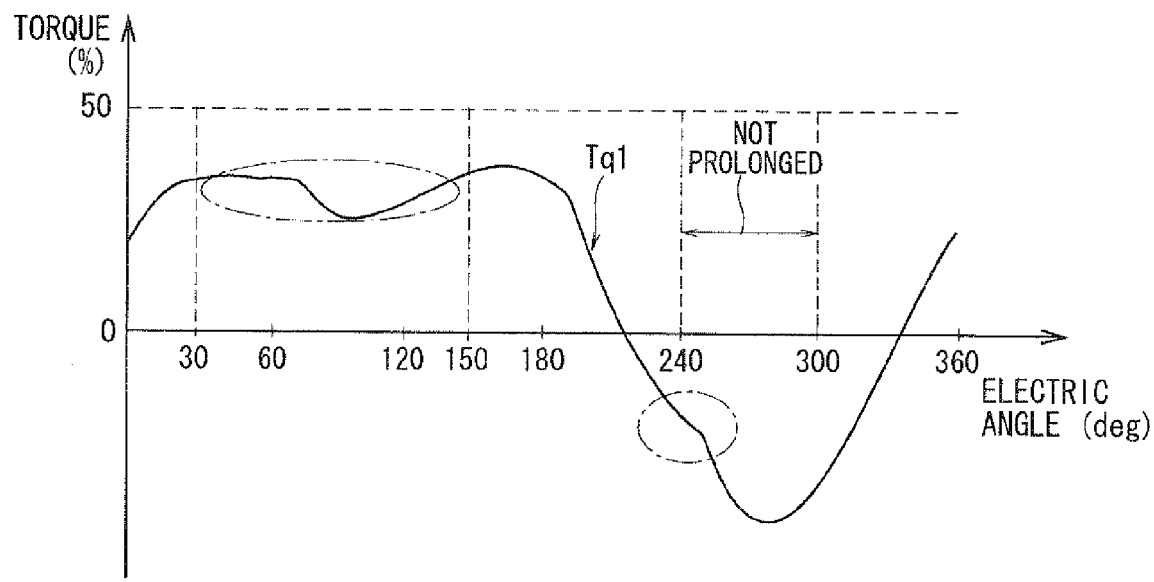

On the other hand, FIG. 19B shows the torque Tq1 which is outputted by the failure system (first system) in the state where the ON failure occurred in the U high-side FET 21 and the motor 10 is rotated at high speeds. The higher the rotational speed of the motor 10 becomes, the larger the brake torque which is generated in the motor 10 becomes. Accordingly, as shown in FIG. 19B, the torque which is outputted by the failure system when the motor 10 is rotated at high speeds becomes, as a whole, smaller than the torque which is outputted by the failure system when the motor 10 is rotated at low speeds (FIG. 19A).

Here, as shown in FIG. 19A and FIG. 19B, the waveform of a portion surrounded by a chained ellipse is disturbed because the inductance component of the motor 10 influences the torque.

In this embodiment, when the ON failure occurred in one of the FETs (abnormal state), the control unit 70 controls the first inverter unit 20 and the second inverter unit 30 corresponding to the rotational speed of the motor 10.

The manner of control of the first inverter unit 20 and the second inverter unit 30 when the motor 10 is not rotated (motor stopping time) is exactly equal to the manner of control described previously (FIG. 17A and FIG. 17B).

For example, when the ON failure occurred in the U high-side FET 21 and the motor 10 is rotated at low speeds, the control unit 70 controls the first inverter unit 20 by changing the value of the current Iq3 shown in FIG. 17A to the value proportional to the torque value (FIG. 19A) which can be outputted by the failure system (first system). This value is referred to as a low-speed-rotation-time change current. Due to such a control, the output torque Tq1 of the motor 10 by the first inverter unit 20 (first system) takes the value shown in FIG. 19A. On the other hand, the control unit 70 controls the second inverter unit 30 by changing the value of the current Iq4 shown in FIG. 17B to the value which is obtained by subtracting the value of the low-speed-rotation-time change current from the maxim value (fixed value) of the low-speed-rotation-time change current. Due to such a control, the torque which cancels the change of the output torque generated by the first system (Tq1: FIG. 19A) is added to the output torque by the second inverter unit 30 (second system) and, hence, the output torque Tq of the motor 10 as a whole takes the fixed value shown in FIG. 18B.

When the motor 10 is rotated at high speeds, the control unit 70 controls the first inverter unit 20 by changing the value of the current Iq3 shown in FIG. 17A to the value proportional to the torque value (FIG. 19B) which can be outputted by the failure system (first system). This value is referred to as a high-speed-rotation-time change current. Due to such a control, the output torque Tq1 of the motor 10 by the first inverter unit 20 (first system) takes the value shown in FIG. 19B. On the other hand, the control unit 70 controls the second inverter unit 30 by changing the value of the current Iq4 shown in FIG. 17B to the value which is obtained by subtracting the value of the high-speed-rotation-time change current from the maxim value (fixed value) of the high-speed-rotation-time change current. Due to such a control, the torque which cancels the change of the output torque generated by the first system (Tq1: FIG. 19B) is added to the output torque generated by the second inverter unit 30 (second system) and, hence, the output torque Tq of the motor 10 as a whole takes the fixed value shown in FIG. 18B.

Here, in this embodiment, the value of the current Iq3 which flows at the time of control when the motor 10 is rotated (FIG. 17A) may be set to a sum of the value of electric current Iq3 shown in FIG. 17A and the value proportional to rotational speed of the motor 10.

In this manner, according to this embodiment, even when the ON failure occurred in one of the FETs, irrespective of rotational speeds of the motor 10, the output torque of the motor 10 can be held substantially equal (100%) to the corresponding output torque at the normal state and can be set to the fixed value.

Further, in this embodiment, the driving of the motor 10 is continued also by the failure system as much as possible. Accordingly, in this embodiment, it is possible to prevent the output torque of the motor 10 as a whole from becoming 50% of the output torque at the normal state as in the case of the first embodiment. Further, compared to the second embodiment, a load imposed on the ON failure system can be reduced.

In this embodiment, the manner of determining the presence or non-presence of the occurrence of the short-circuiting failure and the manner of specifying the FET in which the ON failure occurred which the control unit 70 performs are substantially equal to the corresponding manners of the first embodiment.

As described above, according to this embodiment, when the short-circuiting failure occurred in either one of the first inverter unit 20 (first system) and the second inverter unit 30 (second system), the control unit 70 performs the control such that both of the high-side FET and the low-side FET or the non-failure FET (high-side FET or low-side FET) of the leg of the failure phase out of the legs of the failure system, assume the OFF state. Due to such a control, it is possible to prevent the leg of the failure phase from assuming the conductive state. In this embodiment, when the short-circuiting failure occurred, the control unit 70 continues the driving of the motor 10 by the leg of the non-failure phase out of the legs of the failure system and the legs of the non-failure system. That is, in this embodiment, when the short-circuiting failure occurred, the driving of the motor 10 by the failure system is not completely stopped. Rather the driving of the motor 10 is continued also by the failure system as much as possible. Here, by driving the motor 10 by the leg of the non-failure phase out of the legs of the failure system, the output of the failure system is changed. Accordingly, at this time, the control unit 70 controls the FETs of the non-failure system so as to cancel the change of the output of the failure system or to reduce the influence of the change exerted on the driving of the motor 10.

In this embodiment, when the short-circuiting failure occurred, by performing the control, it is possible to suppress the change of the output torque of the motor 10 due to the change of the output of the failure system. As a result, the output torque of the motor 10 can be set to the fixed value. In this embodiment, the driving of the motor 10 is continued also by the failure system as much as possible when the short-circuiting failure occurred. Thus, the output torque of the motor 10 can be set substantially equal (100%) to the corresponding output torque at the normal state and can be set to the fixed value while suppressing the increase of a load of the non-failure system.

In this manner, the control apparatus of this embodiment can, when the ON failure occurred in one of the FETs, continue the stable driving of the motor 10 by suppressing the influence of the change of the output of the failure system exerted on the driving of the motor 10 as much as possible. Accordingly, discomfort which a driver perceives from the electric power steering system which uses the motor 10 in manipulating the steering wheel when the short-circuiting failure occurred can be reduced.

Further, in this embodiment, the control unit 70 performs the control of the FETs of the failure system such that, when the driving of the motor 10 is continued by the leg of the non-failure phase out of the legs of the failure system, the voltage which is larger than the voltage at the usual time is applied to the phase which exhibits a high degree of contribution to the torque of the motor 10 out of phases of the failure system for the predetermined period. More specifically, the control unit 70 performs the control of the FETs such that the voltage which is larger than the voltage at the usual time is applied to the phase which exhibits the high degree of contribution to the torque of the motor 10 by substituting the voltage vector which cannot be outputted with the voltage vector which can be outputted in the failure system (voltage vector substitution control). Due to such a control, the output torque of the motor 10 generated by the failure system can be enhanced. Further, even when the short-circuiting failure in which the winding of the motor 10 and the common bus line for respective FETs are short-circuited with each other occurs, by performing the similar control, the output torque of the motor 10 generated by the failure system can be enhanced.

Fourth Embodiment

The control apparatus 1 according to the fourth embodiment differs from the first embodiment with respect to the number of current detection parts and the like.

Figure 20:
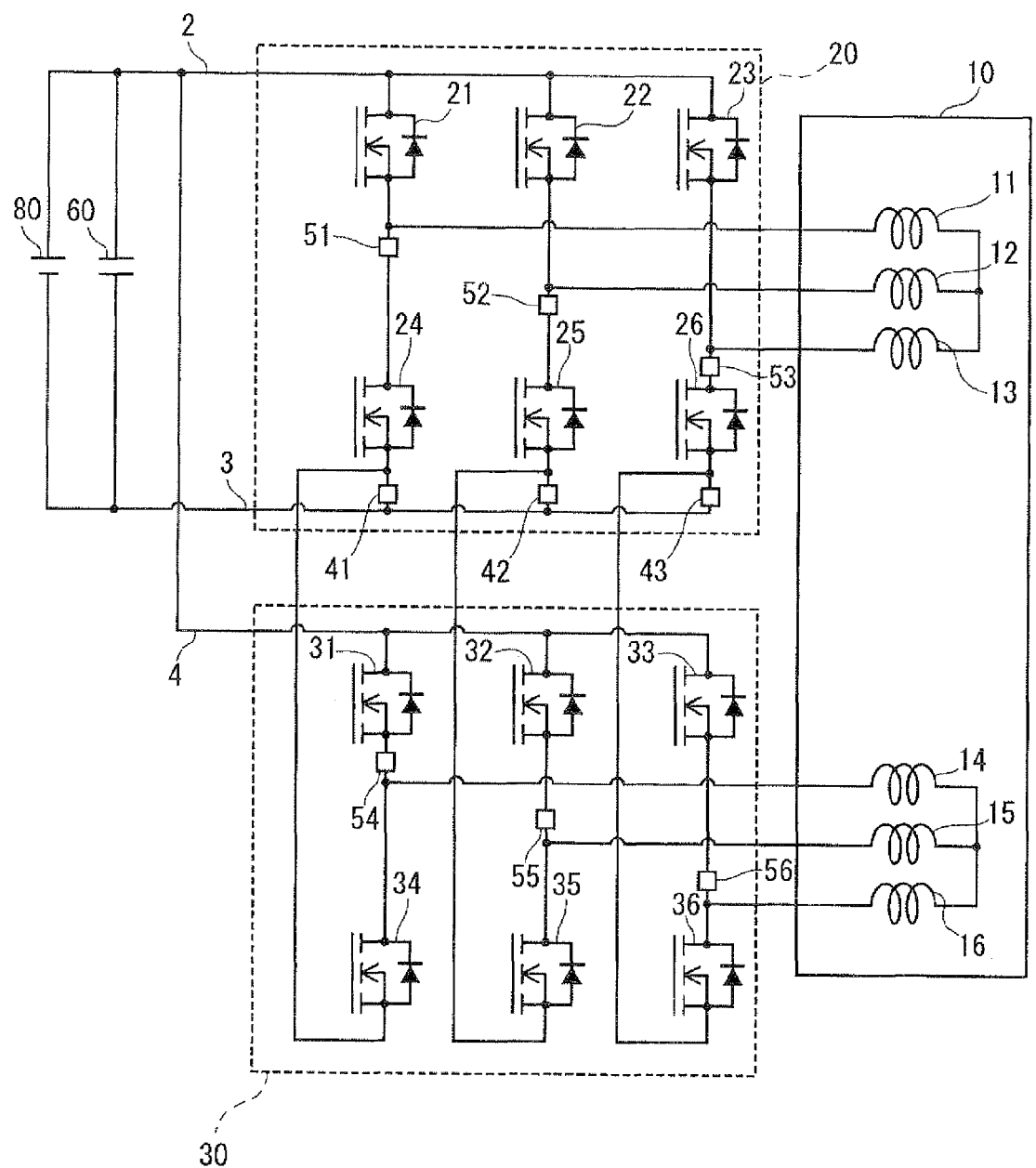
FIG. 20 is a schematic diagram showing a part of a control apparatus according to a fourth embodiment of the present invention.

As shown in FIG. 20, in the fourth embodiment, as the current detection part 40, only three current detection parts 41 to 43 are arranged in the first inverter unit 20. No current detection parts are arrange in the second inverter unit 30. Positions where the current detection parts 41 to 43 are arranged are substantially equal to the places where the current detection parts are arranged in the first embodiment (FIG. 1). In this embodiment, the source of the FET 34 of the second inverter unit 30 is connected between the FET 24 and the current detection part 41 in the first inverter unit 20. The source of the FET 35 is connected between the FET 25 and the current detection part 42. The source of the FET 36 is connected between the FET 26 and the current detection part 43. Due to such a configuration, the current detection parts 41 to 43 can detect currents which flow in respective phases of the first system or in respective phases of the second system. In FIG. 20, for brevity, the control unit 70, the connection lines leading to the control unit 70 from the respective FETs and the like are omitted.

Due to the configuration, in this embodiment, when the ON failure occurred in one of the U high-side FET 21, the U low-side FET 24, the U high-side FET 31 and the U low-side FET 34, the current of the predetermined value or more flows in the current detection part 41. Accordingly, the control unit 70 can determine that the short-circuiting failure occurred in the U-phase of the first system or the second system based on the detection value of the current detection parts 41. In the same manner, the control unit 70 can determine that the short-circuiting failure occurred in the V-phase of the first system or the second system based on the detection value of the current detection parts 42. Further, in the same manner, the control unit 70 can determine that the short-circuiting failure occurred in the W-phase of the first system or the second system based on the detection value of the current detection parts 43.

Next, the processing relating to the determination of presence or non-presence of the occurrence of the short-circuiting failure and the specification of FET in which the ON failure occurred by the control unit 70 is described. This processing per se is substantially similar to the flow shown in FIG. 11 (first embodiment) and, hence, the processing is described in conjunction with FIG. 11.

When the processing shown in FIG. 11 starts, the control unit 70 firstly executes S111.

The control unit 70 determines whether the current detection value 141 of the U-phase, that is, the detection value of the current detection part 41 (FIG. 20) is equal to the predetermined value Ip or more at S111. When the control unit 70 determines that the current detection value V41 of the U-phase is equal to the predetermined value Ip or more (S111: YES), the processing proceeds to S112. On the other hand, when the control unit 70 determines that the current detection value 141 of the U-phase is not equal to the predetermined Ip or more (S111: NO), the processing proceeds to S121.

The control unit 70 determines at S112 that the short-circuiting failure occurred in the U-phase of the first system or the second system based on the detection value 141 of the current detection part 41 at S111. After S112, the processing proceeds to S113.

The control unit 70 stops at S113 the PWM control of both of the first and the second systems, because it cannot be determined in which system the ON failure occurred. After S113, the processing proceeds to S114.

The control unit 70 determines whether the terminal voltage of the U-phase in the first system or the second system, that is, the detection value V51 or V54 of the voltage detection part 51 or the voltage detection part 54 is substantially equal to the power source voltage VPIG at S114. When the control unit 70 determines that the terminal voltage of the U-phase in the first system or the second system is substantially equal to the power source voltage VPIG (S114: YES), the processing proceeds to S115. On the other hand, when the control unit 70 determines that the terminal voltage of the U-phase in the first system or the second system is not substantially equal to the power source voltage VPIG (S114: NO), the processing proceeds to S116.

The control unit 70 determines at S115 that the ON failure occurred in the high-side FET of the U-phase. That is, the control unit 70 specifies the U high-side FET 21 or the U high-side FET 31 as the FET, in which the ON failure occurred, based on the detection value V51 or V54 of the voltage detection part 51 or the voltage detection part 54 detected at S114. Here, at this time, the control unit 70 stores information on the FET (U high-side FET 21 or U high-side FET 31), in which the ON failure occurred, in the memory as the value of the failure flag. When the FET in which the ON failure occurred is specified at S115, the control unit 70 finishes the series of processing shown in FIG. 11.

The control unit 70 determines whether the terminal voltage of the U-phase in the first system or the second system, that is, the detection value V51 or V54 of the voltage detection part 51 or the voltage detection part 54 is substantially equal to the ground voltage GND at S116. When the control unit 70 determines that the terminal voltage of the U-phase in the first system or the second system is substantially equal to the ground voltage GND (S116: YES), the processing proceeds to S117. On the other hand, when the control unit 70 determines that the terminal voltage of the U-phase in the first system or the second system is not substantially equal to the ground voltage GND (S116: NO), the processing returns to S111.

The control unit 70 determines at S117 that the ON failure occurred in the low-side FET of the U-phase. That is, the control unit 70 specifies the U low-side FET 24 or the U low-side FET 34 as the FET, in which the ON failure occurred, based on the detection value of the voltage detection part 51 or the voltage detection part 54 detected at S116. Here, at this time, the control unit 70 stores information on the FET in which the ON failure occurred (U low-side FET 24 or U low-side FET 34) in the memory as the value of the failure flag. When the FET in which the ON failure occurred is specified at S117, the control unit 70 finishes the series of processing shown in FIG. 11.

The control unit 70 determines whether the current detection value of the V-phase, that is, the detection value 142 of the current detection part 42 (FIG. 20) is equal to the predetermined value Ip or more at S121. When the control unit 70 determines that the current detection value 142 of the V-phase is equal to the predetermined value Ip or more (S121: YES), the processing proceeds to S122. On the other hand, when the control unit 70 determines that the current detection value 142 of the V-phase is not equal to the predetermined Ip or more (S121: NO), the processing proceeds to S131.

Processing at S122 to S127 is substantially similar to the processing at S112 to S117 described above and, hence, their description is omitted. Here, when the FET in which the ON failure occurred (V high-side FET or V low-side FET) is specified at S125 or S127, the control unit 70 finishes the series of processing shown in FIG. 11.

The control unit 70 determines whether the current detection value of the W-phase, that is, the detection value 143 of the current detection part 43 (FIG. 20) is equal to the predetermined value Ip or more at S131. When the control unit 70 determines that the current detection value 143 of the W-phase is equal to the predetermined value Ip or more (S131: YES), the processing proceeds to S132. On the other hand, when the control unit 70 determines that the current detection value 143 of the W-phase is not equal to the predetermined Ip or more (S131: NO), the processing returns to S111.

Processing at S132 to S137 is substantially similar to the processing at S112 to S117 described above and, hence, their description is omitted. Here, when the FET (W high-side FET or W low-side FET) in which the ON failure occurred is specified at S135 or S137, the control unit 70 finishes the series of processing shown in FIG. 11.

The configuration other than the configuration and the manner of control of the respective inverter units by the control unit 70 when the short-circuiting failure occurred according to this embodiment are substantially similar to the corresponding configuration and the corresponding manner of control according to the first embodiment.

As described above, in this embodiment, the control apparatus is provided with the current detection parts 41 to 43 which can detect currents which flow in the respective phases of the plurality of winding sets (first winding set 18 or second winding set 19). Further, the control unit 70 determines the presence or the non-presence of the occurrence of the short-circuiting failure based on the current detection values detected by the current detection parts 41 to 43. Due to such a configuration, the control unit 70 can determine the presence or the non-presence of the occurrence of the short-circuiting failure with high accuracy.

Fifth Embodiment

The control apparatus 1 according to the fifth embodiment differs from the first embodiment with respect to the number of the current detection parts 40 and positions of arrangement of the current detection parts 40 as well as the processing of the determination of presence or non-presence of the occurrence of the short-circuiting failure.

Figure 21:
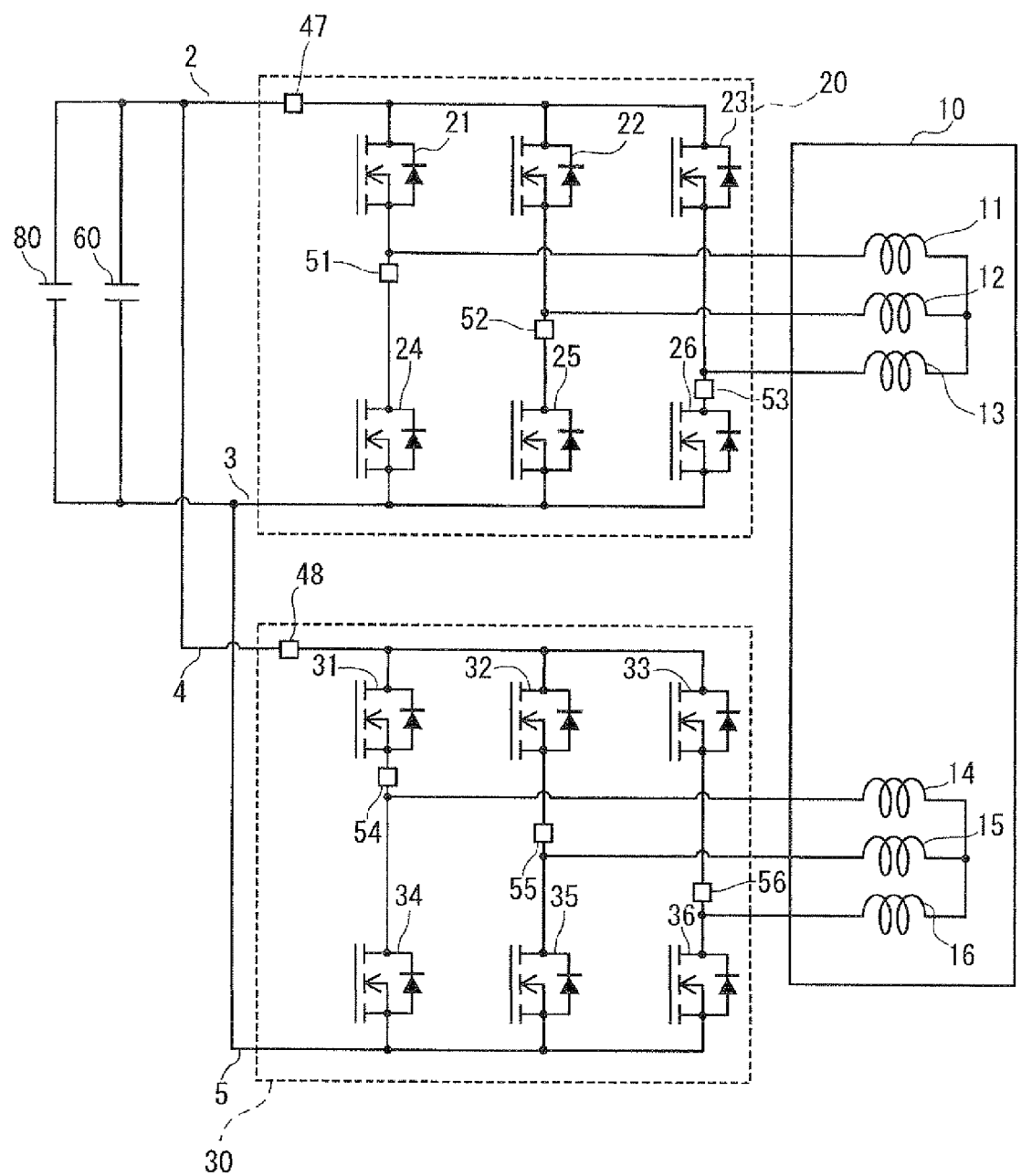
FIG. 21 is a schematic diagram showing a part of a control apparatus according to a fifth embodiment of the present invention.

As shown in FIG. 21, in the fifth embodiment, as the current detection parts 40, only two current detection parts 47 and 48 are arranged in the first inverter unit 20 and the second inverter unit 30, respectively. The current detection part 47 is arranged on the high side bus 2 between the battery 80 and the U high-side FETs 21, 22, 23. Due to such a configuration, the current detection part 47 can detect the current which flows in the high side bus 2 which is a common bus line for the plurality of legs 27 to 29. Accordingly, the current detection part 47 can detect the current which flows in the first system (first inverter unit 20). Further, the current detection part 48 is arranged on the high side bus 4 between the battery 80 and the U high-side FETs 31, 32, 33. Due to such a configuration, the current detection part 48 can detect the current which flows in the high side bus 4 which is a common bus line for the plurality of legs 37 to 39. Accordingly, the current detection part 48 can detect the current which flows in the second system (second inverter unit 30). In FIG. 21, for the sake of brevity, the control unit 70, the connection lines leading to the control unit 70 from the respective FETs and the like are not shown.

Due to this configuration, when the ON failure occurred in one of the FETs 21 to 26 in the first system, a current of a predetermined value or more flows in the current detection part 47. Accordingly, the control unit 70 can determine that the short-circuiting failure occurred in one of the phases in the first system based on the detection value of the current detection part 47. In the same manner, the control unit 70 can determine that the short-circuiting failure occurred in one of the phases in the second system based on the detection value of the current detection part 48.

Figure 22:
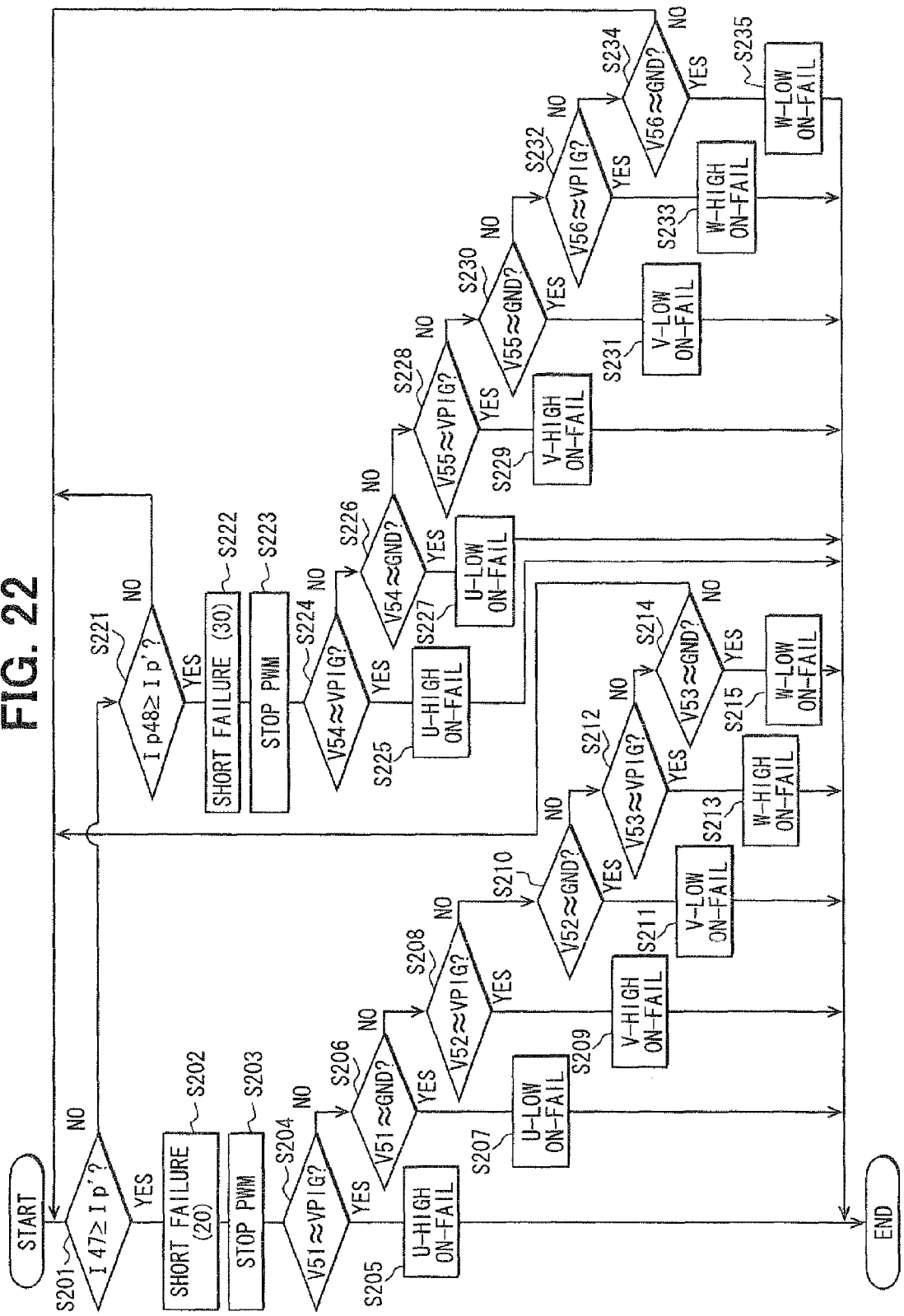
FIG. 22 is a flowchart showing processing relating to "the determination of presence or non-presence of the occurrence of the short-circuiting failure" and "the specification of failure switching element" which the control apparatus according to the fifth embodiment performs.

Next, the processing relating to the determination of presence or non-presence of the occurrence of the short-circuiting failure and the specification of FET in which the ON failure occurred by the control unit 70 is described in conjunction with FIG. 22.

The control unit 70 starts the processing shown in FIG. 22 when the driving of a vehicle starts, that is, when a driver turns on the ignition key of the vehicle.

The control unit 70 determines whether the current detection value of the first system, that is, the detection value 147 of the current detection part 47 is equal to a predetermined value Ip' or more at S201. When the control unit 70 determines that the current detection value Ip47 of the current detection part 47 is equal to the predetermined value Ip' or more (S201: YES), the processing proceeds to S202. On the other hand, when the control unit 70 determines that the current detection value Ip47 of the current detection part 47 is not equal to the predetermined value Ip' or more (S201: NO), the processing proceeds to S221.

The control unit 70 determines at S202 that the short-circuiting failure occurred in one of phases of the first system (first inverter unit 20) based on the detection value 147 of the current detection part 47 detected at S201. After S202, the processing proceeds to S203.

The control unit 70 stops the PWM control of the first system, in which the short-circuiting failure occurred, at S203. After S203, the processing proceeds to S204.

The control unit 70 determines whether the terminal voltage of the U-phase in the first system in which the short-circuiting failure occurred, that is, the detection value V51 of the voltage detection part 51 is substantially equal to the power source voltage VPIG at S204. When the control unit 70 determines that the detection value V51 of the voltage detection part 51 is substantially equal to the power source voltage VPIG (S204: YES), the processing proceeds to S205. On the other hand, when the control unit 70 determines that the detection value of the voltage detection part 51 is not substantially equal to the power source voltage VPIG (S204: NO), the processing proceeds to S206.

The control unit 70 determines at S205 that the ON failure occurred in the high-side FET of the U-phase. That is, the control unit 70 specifies the U high-side FET 21 as the FET, in which the ON failure occurred, based on the detection value V51 of the voltage detection part 51 at S204. Here, at this time, the control unit 70 stores information on the FET in which the ON failure occurred (U high-side FET 21) in the memory as the value of the failure flag. When the FET in which the ON failure occurred is specified at S205, the control unit 70 finishes the series of processing shown in FIG. 22.

The control unit 70 determines whether the terminal voltage of the U-phase in the first system in which the short-circuiting failure occurred, that is, the detection value V51 of the voltage detection part 51 is substantially equal to the ground voltage GND at S206. When the control unit 70 determines that the detection value V51 of the voltage detection part 51 is substantially equal to the ground voltage GND (S206: YES), the processing proceeds to S207. On the other hand, when the control unit 70 determines that the detection value V51 of the voltage detection part 51 is not substantially equal to the ground voltage GND (S206: NO), the processing proceeds to S208.

The control unit 70 determines at S207 that the ON failure occurred in the low-side FET of the U-phase. That is, the control unit 70 specifies the U low-side FET 24 as the FET, in which the ON failure occurred, based on the detection value of the voltage detection part 51 detected at S206. Here, at this time, the control unit 70 stores information on the FET, in which the ON failure occurred (U low-side FET 24) in the memory as the value of the failure flag. When the FET, in which the ON failure occurred, is specified at S207, the control unit 70 finishes the series of processing shown in FIG. 22.

The control unit 70 determines whether the terminal voltage of the V-phase in the first system, in which a short-circuiting failure occurred, that is, the detection value V52 of the voltage detection part 52 is substantially equal to the power source voltage VPIG at S208. When the control unit 70 determines that the detection value V52 of the voltage detection part 52 is substantially equal to the power source voltage VPIG (S208: YES), the processing proceeds to S209. On the other hand, when the control unit 70 determines that the detection value V52 of the voltage detection part 52 is not substantially equal to the power source voltage VPIG (S208: NO), the processing proceeds to S210.

The control unit 70 determines at S209 that the ON failure occurred in the high-side FET of the V-phase. That is, the control unit 70 specifies the V high-side FET 22 as the FET, in which the ON failure occurred, based on the detection value V52 of the voltage detection part 52 at S208. Here, at this time, the control unit 70 stores information on the FET in which the ON failure occurred (V high-side FET 22) in the memory as the value of the failure flag. When the FET in which the ON failure occurred is specified at S209, the control unit 70 finishes the series of processing shown in FIG. 22.

The control unit 70 determines whether the terminal voltage of the V-phase in the first system, in which the short-circuiting failure occurred, that is, the detection value V52 of the voltage detection part 52 is substantially equal to the ground voltage GND at S210. When the control unit 70 determines that the detection value V52 of the voltage detection part 52 is substantially equal to the ground voltage GND (S210: YES), the processing proceeds to S211. On the other hand, when the control unit 70 determines that the detection value V52 of the voltage detection part 52 is not substantially equal to the ground voltage GND (S210: NO), the processing proceeds to S212.

The control unit 70 determines at S211 that the ON failure occurred in the low-side FET of the V-phase. That is, the control unit 70 specifies the V low-side FET 25 as the FET, in which the ON failure occurred, based on the detection value V52 of the voltage detection part 52 detected at S210. Here, at this time, the control unit 70 stores information on the FET in which the ON failure occurred (V low-side FET 25) in the memory as the value of the failure flag. When the FET in which the ON failure occurred is specified at S211, the control unit 70 finishes the series of processing shown in FIG. 22.

The control unit 70 determines whether the terminal voltage of the W-phase in the first system in which the short-circuiting failure occurred, that is, the detection value V53 of the voltage detection part 53 is substantially equal to the power source voltage VPIG at S212. When the control unit 70 determines that the detection value V53 of the voltage detection part 53 is substantially equal to the power source voltage VPIG (S212: YES), the processing proceeds to S213. On the other hand, when the control unit 70 determines that the detection value V53 of the voltage detection part 53 is not substantially equal to the power source voltage VPIG (S212: NO), the processing proceeds to S214.

The control unit 70 determines at S213 that the ON failure occurred in the high-side FET of the W-phase. That is, the control unit 70 specifies the W high-side FET 23 as the FET, in which the ON failure occurred, based on the detection value of the voltage detection part 53 detected at S212. Here, at this time, the control unit 70 stores information on the FET in which the ON failure occurred (W high-side FET 23) in the memory as the value of the failure flag. When the FET in which the ON failure occurred is specified at S213, the control unit 70 finishes the series of processing shown in FIG. 22.

The control unit 70 determines whether the terminal voltage of the W-phase in the first system in which the short-circuiting failure occurred, that is, the detection value V53 of the voltage detection part 53 is substantially equal to the ground voltage GND at S214. When the control unit 70 determines that the detection value V53 of the voltage detection part 53 is substantially equal to the ground voltage GND (S214: YES), the processing proceeds to S215. On the other hand, when the control unit 70 determines that the detection value V53 of the voltage detection part 53 is not substantially equal to the ground voltage GND (S214: NO), the processing returns to S201.

The control unit 70 determines at S215 that the ON failure occurred in the low-side FET of the W-phase. That is, the control unit 70 specifies the W low-side FET 26 as the FET, in which the ON failure occurred, based on the detection value V53 of the voltage detection part 53 at S214. Here, at this time, the control unit 70 stores information on the FET in which the ON failure occurred (W low-side FET 26) in the memory as the value of the failure flag. When the FET in which the ON failure occurred is specified at S215, the control unit 70 finishes the series of processing shown in FIG. 22.

The control unit 70 determines whether the current detection value of the second system, that is, the detection value Ip48 of the current detection part 48 (FIG. 21) is equal to the predetermined value Ip' or more at S221. When the control unit 70 determines that the current detection value 148 of the current detection part 48 is equal to the predetermined value Ip' or more (S221: YES), the processing proceeds to S222. On the other hand, when the control unit 70 determines that the current detection value 148 of the current detection part 48 is not equal to the predetermined value Ip' or more (S221: NO), the processing returns to S201.

The processing at S222 to S235 is substantially similar to the processing at S202 to S215 described above and, hence, the description of the processing at S222 to S235 is omitted. When the FET in which the ON failure occurred (one of the FET 31 to the FET 36 in the second system) is specified at S225, S227, S229, S231, S233 or S235, the control unit 70 finishes the series of processing shown in FIG. 22.

In this manner, the control unit 70 performs the determination of system in which the short-circuiting failure occurred, that is, the determination of presence or the non-presence of the occurrence of the short-circuiting failure at S201, S202, S221, S222 and performs the determination of FET in which the ON failure occurred, that is, the specification of FET, in which the ON failure occurred, at S203 to S215, S223 to S235".

The configuration other than the configuration and the manner of control of the respective inverter units by the control unit 70 when the short-circuiting failure occurred according to this embodiment are substantially similar to the corresponding configuration and the corresponding manner of control according to the first embodiment.

As described above, the control apparatus 1 is provided with the current detection parts 47, 48 which can detect currents which flow in the common bus line for the plurality of legs 27 to 29 or legs 37 to 39. Then, the control unit 70 determines the presence or the non-presence of the occurrence of the short-circuiting failure based on the current detection values 147, 148 detected by the current detection parts 47, 48. Due to such a configuration, the control unit 70 can determine the presence or the non-presence of the occurrence of the short-circuiting failure with high accuracy.

Sixth Embodiment

The control apparatus 1 according to the sixth embodiment differs from the first embodiment with respect to the manner of the determination of presence or non-presence of the occurrence of the short-circuiting failure by the control unit 70.

This embodiment is substantially similar to the first embodiment with respect to the positions of the current detection parts 41 to 46 and the voltage detection parts 51 to 56 (FIG. 1).

Figure 23:
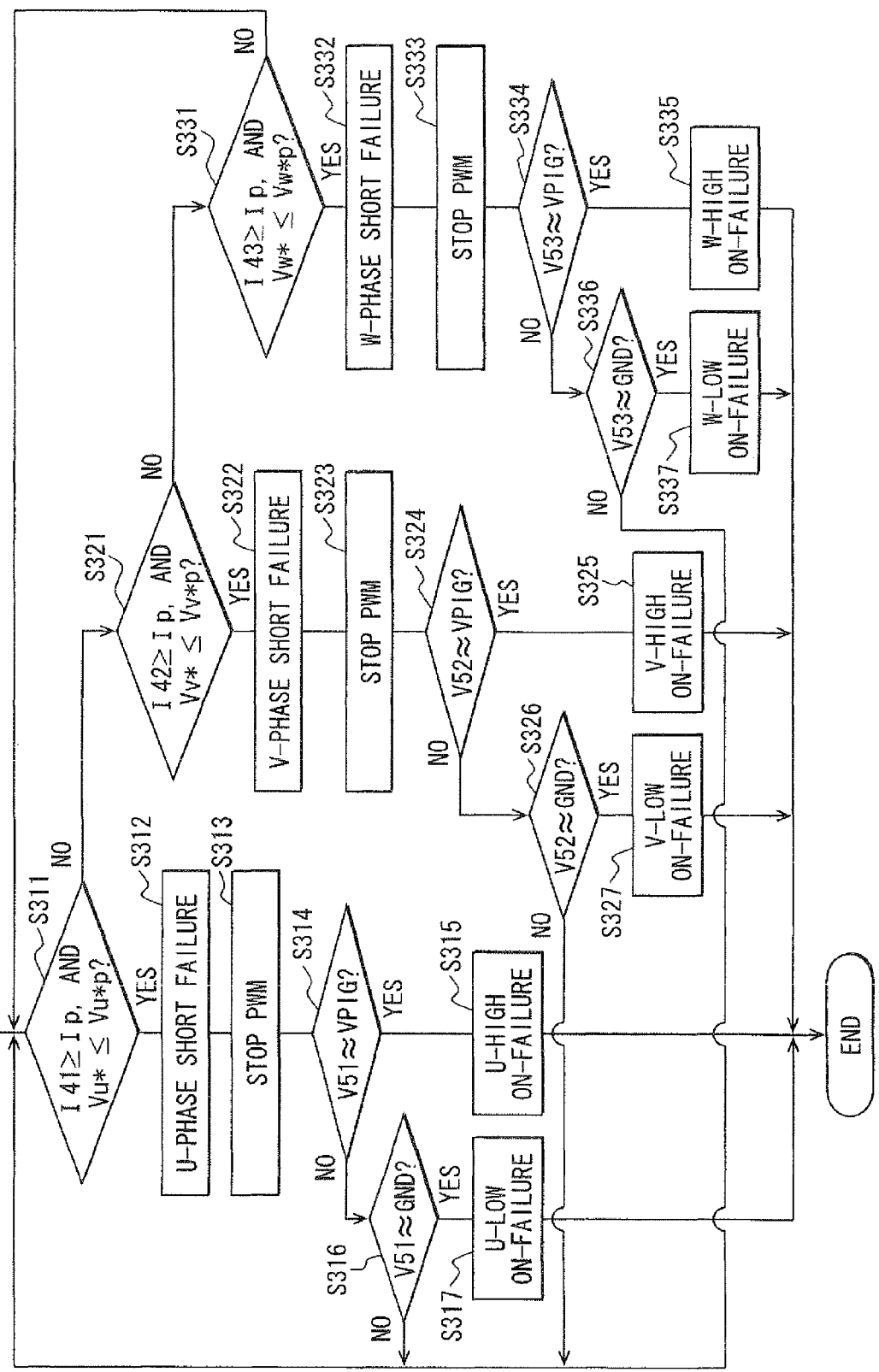
FIG. 23 is a diagram showing processing relating to the determination of presence or non-presence of the occurrence of the short-circuiting failure and the specification of failure switching element which a control apparatus according to a sixth embodiment of the present invention performs.

Next, the processing relating to the determination of presence or non-presence of the occurrence of the short-circuiting failure and the specification of FET, in which the ON failure occurred, executed by the control unit 70 of this embodiment is described in conjunction with FIG. 23.

When the processing shown in FIG. 23 starts, the control unit 70 firstly executes S311.

The control unit 70 determines whether the current detection value of the U-phase, that is, the detection value 141 (or 144) of the current detection part 41 (or 44) is equal to the predetermined value Ip or more and the voltage command value of the U-phase, that is, the U-phase command voltage Vu* is equal to the predetermined value Vu*p or less at S311. When the control unit 70 determines that the current detection value 141 of the U-phase is equal to the predetermined value Ip or more and the voltage command value Vu* of the U-phase is equal to the predetermined value Vu*p or less" (S311: YES), the processing proceeds to S312. On the other hand, when the control unit 70 determines that the current detection value 141 of the U-phase is not equal to the predetermined value Ip or more and the voltage command value Vu* of the U-phase is not equal to the predetermined value or less (S311: NO), the processing proceeds to S321.

The control unit 70 determines at S312 that the short-circuiting failure occurred in the U-phase of the first system or the second system based on the detection value of the current detection part 41 or the current detection part 44 detected at S311. After S312, the processing proceeds to S313.

The control unit 70 stops the PWM control of the system, in which the short-circuiting failure occurred, at S313. After S313, the processing proceeds to S314.

The control unit 70 determines whether the terminal voltage of the U-phase in the system, in which the short-circuiting failure occurred, that is, the detection value V51 (or V54) of the voltage detection part 51 (or 54) is substantially equal to the power source voltage VPIG at S314. When the control unit 70 determines that the terminal voltage of the U-phase in the system, in which the short-circuiting occurred, is substantially equal to the power source voltage VPIG (S314: YES), the processing proceeds to S315. On the other hand, when the control unit 70 determines that the terminal voltage of the U-phase in the system, in which the short-circuiting occurred, is not substantially equal to the power source voltage VPIG (S314: NO), the processing proceeds to S316.

The control unit 70 determines at S315 that the ON failure occurred in the high-side FET of the U-phase. That is, the control unit 70 specifies the U high-side FET 21 or the U high-side FET 31 as the FET, in which the ON failure occurred, based on the detection value of the voltage detection part 51 or the voltage detection part 54 at S314. Here, at this time, the control unit 70 stores information on the FET, in which the ON failure occurred (U high-side FET 21 or U high-side FET 31) in the memory as a value of the failure flag. When the FET in which the ON failure occurred is specified at S315, the control unit 70 finishes the series of processing shown in FIG. 23.

The control unit 70 determines whether the terminal voltage of the U-phase in the system in which a short-circuiting failure occurred, that is, the detection value V51 (r V54) of the voltage detection part 51 (or 54) is substantially equal to the ground voltage GND at S316. When the control unit 70 determines that the terminal voltage of the U-phase in the system in which the short-circuiting failure occurred is substantially equal to the ground voltage GND (S316: YES), the processing proceeds to S317. On the other hand, when the control unit 70 determines that the terminal voltage of the U-phase in the system in which the short-circuiting failure occurred is not substantially equal to the ground voltage GND (S316: NO), the processing returns to S311.

The control unit 70 determines at S317 that the ON failure occurred in the low-side FET of the U-phase. That is, the control unit 70 specifies the U low-side FET 24 or the U low-side FET 34 as the FET, in which the ON failure occurred, based on the detection value of the voltage detection part 51 or the voltage detection part 54 detected at S316. Here, at this time, the control unit 70 stores information on the FET in which the ON failure occurred (U low-side FET 24 or U low-side FET 34) in the memory as a value of the failure flag. When the FET in which the ON failure occurred is specified at S317, the control unit 70 finishes the series of processing shown in FIG. 23.

The control unit 70 determines whether the current detection value of the V-phase, that is, the detection value 142 (145) of the current detection part 42 (or 45) is equal to the predetermined value Ip or more and the voltage command value of the V-phase, that is, the V-phase command voltage Vv* is equal to the predetermined value Vv*p or less at S321. When the control unit 70 determines that the current detection value 142 of the V-phase is equal to the predetermined value Ip or more and the voltage command value Vv* of the V-phase is equal to the predetermined value Vv*p or less" (S321: YES), the processing proceeds to S322. On the other hand, when the control unit 70 determines that the current detection value 142 of the V-phase is not equal to the predetermined value Ip or more and the voltage command value Vv* of the V-phase is not equal to the predetermined value Vv*p or less" (S321: NO), the processing proceeds to S331.

The processing at S322 to S327 is substantially similar to the processing at S312 to S317 described above and, hence, the description of the processing at S322 to S327 is omitted. When the FET in which the ON failure occurred (V high-side FET or V low-side FET) is specified at S325 or S327, the control unit 70 finishes the series of processing shown in FIG. 23.

The control unit 70 determines whether the current detection value of the W-phase, that is, the detection value 143 (or 146) of the current detection part 43 (or 46) is equal to the predetermined value Ip or more and the voltage command value of the W-phase, that is, the W-phase command voltage Vw* is equal to the predetermined value Vw*p or less at S331. When the control unit 70 determines that the current detection value Ip 43 of the W-phase is equal to the predetermined value Ip or more and the voltage command value Vw* of the W-phase is equal to the predetermined value Vw*p or less (S331: YES), the processing proceeds to S332. On the other hand, when the control unit 70 determines that the current detection value 143 of the W-phase is not equal to the predetermined value Ip or more and the voltage command value Vw* of the W-phase is not equal to the predetermined value Vw*p or less" (S331: NO), the processing returns to S311.

The processing at S332 to S337 is substantially similar to the processing at S312 to S317 described above and, hence, the description of the processing at S332 to S337 is omitted. When the FET in which the ON failure occurred (W high-side FET or W low-side FET) is specified at S335 or S337, the control unit 70 finishes the series of processing shown in FIG. 23.

In this manner, the control unit 70 performs the determination of system and the phase in which the short-circuiting failure occurred, that is, the determination of presence or non-presence of the occurrence of the short-circuiting failure at S311, S312, S321, S322, S331 and S332, and performs the determination of FET, in which the ON failure occurred, that is, the specification of FET, in which the ON failure occurred, at S313 to S317, S323 to S327 and S333 to S337.

The configuration other than the configuration and the manner of control of the respective inverter units by the control unit 70 when the short-circuiting failure occurred according to this embodiment are substantially equal to the corresponding configuration and the corresponding manner of control according to the first embodiment.

As described above, according to this embodiment, the control apparatus is provided with the current detection parts 41 to 46 which detect currents which flow in the respective phases of the plurality of winding sets (first winding set 18 or second winding set 19), and the voltage detection parts 51 to 56 which detect voltages of respective phases of the plurality of winding sets (first winding set 18 or second winding set 19). Then, the control unit 70 performs the determination of presence or the non-presence of the occurrence of the short-circuiting failure by comparing current detection values detected by the current detection parts 41 to 46 with predetermined current values and by comparing voltage command values (Vu*, Vv*, Vw*) with predetermined voltage values. Due to such a configuration, the control unit 70 can thus determine the presence or non-presence of the occurrence of the short-circuiting failure with high accuracy.

Other Embodiments

In the third embodiment (FIGS. 15A to 19B), the control unit 70 enhances the output torque by the failure system by performing the voltage vector substitution control and, thereafter, controls the switching elements of the non-failure system such that the change of the output of the failure system is cancelled or the influence of the change exerted on the driving of the rotary machine 10 is reduced. Alternatively, the control unit 70 may control the switching element of the non-failure system such that the change of the output of the failure system is canceled or the influence of the change exerted on the driving of the rotary machine 10 is reduced without performing the voltage vector substitution control. That is, the output torque by the failure system is not enhanced in advance, and such an amount of torque, which can be enhanced by the voltage vector substitution control, is compensated by the output torque by the non-failure system.

In the plurality of embodiments, the determination of presence or non-presence of the occurrence of the short-circuiting failure is performed based on the current detection values detected by the current detection parts, and the specification of failure switching element is performed based on the voltage detection values detected by the voltage detection parts. Alternatively, the control unit may perform both of the determination of presence or non-presence of the occurrence of the short-circuiting failure and the specification of failure switching element based on the voltage detection values detected by the voltage detection parts.

In the sixth embodiment, the control unit performs the determination of presence or non-presence of the occurrence of the short-circuiting failure by comparing the current detection values detected by the current detection parts with the predetermined current values and by comparing the voltage command values with the predetermined voltage values. Alternatively, the control unit may perform the determination of presence or non-presence of the occurrence of the short-circuiting failure by comparing the current detection values detected by the current detection parts with the predetermined current values and by comparing the voltage detection values detected by the voltage detection parts with the predetermined voltage values.

The processing relating to the determination of presence or non-presence of the occurrence of the short-circuiting failure and the processing relating to the specification of failure switching element described in conjunction with the fourth to sixth embodiments may be applicable to the processing relating to the determination of presence or non-presence of the occurrence of the short-circuiting failure and the processing relating to the specification of failure switching element in the second and third embodiments, respectively.

The present invention is not limited to the disclosed embodiments but may be implemented differently as follows. For example, the control apparatus may have three or more systems of inverter units. The control apparatus may be applied to a multiple-phase rotary machine used in other apparatuses.

What is claimed is:

1. A control apparatus for a multi-phase rotary machine for controlling driving of the multi-phase rotary machine including a plurality of winding sets, each of which is formed of a plurality of windings corresponding to a plurality of phases, respectively, the control apparatus comprising:
a plurality of inverter units forming a plurality of systems, each of the inverter units having a plurality of legs provided in correspondence to the plurality of phases, each of the legs including a high-side switching element and a low-side switching element; and
a control unit for driving the multi-phase rotary machine by calculating a voltage command value, which is a command value of a voltage applied to each of the windings, and by controlling ON/OFF switching of the high-side switching element and the low-side switching element based on the voltage command value,
wherein the control unit is configured to
in a case where a short-circuiting failure occurred between a common bus at a high-side or a low-side of the leg and any one of the phases of the windings even when the high-side switching element and the low-side switching element are controlled to assume the OFF states,
control all of the high-side switching elements and the low-side switching elements of a failure system into OFF states, respectively,
continue to drive the multi-phase rotary machine by the legs of a no-failure system, and
control the high-side switching element and the low-side switching element of each leg in the no-failure system such that an output is cancelled or an influence of the output exerted on the driving of the multi-phase rotary machine is reduced, the output being generated by the short-circuiting failure in the failure system and resistive to driving of the multi-phase rotary machine.

2. The control apparatus for a multi-phase rotary machine according to claim 1, further comprising:
a current detection part provided to detect a current, which flows in each phase of the windings or flows in the common bus of the legs,
wherein the control unit is configured to determine presence or non-presence of the short-circuiting failure based on a current detection value of the current detection part.

3. The control apparatus for a multi-phase rotary machine according to claim 2, further comprising:
a voltage detection part provided to detecting a voltage of each phase of the windings,
wherein the control unit determines presence or non-presence of occurrence of the short-circuiting failure and specifies a failure switching element of the switching elements, based on a voltage detection value of the voltage detection part produced when both of or either one of the high-side switching element and the low-side switching element are driven to assume the OFF state.

4. The control apparatus for a multi-phase rotary machine according to claim 2, further comprising:
a current detection part provided to detect a current, which flows in each phase of the windings or flows in the common bus of the legs; and
a voltage detection part provided to detect a voltage of each phase of the windings,
wherein the control unit determines presence or non-presence of occurrence of the short-circuiting failure and specifies a failure switching element of the switching elements, by comparing a current detection value of the current detection part with a predetermined current value and by comparing a voltage detection value of the voltage detection part or a voltage command value with a predetermined voltage value.

5. The control apparatus for a multi-phase rotary machine according to claim 1, further comprising:
a voltage detection part provided to detecting a voltage of each phase of the windings,
wherein the control unit determines presence or non-presence of occurrence of the short-circuiting failure and specifies a failure switching element of the switching elements, based on a voltage detection value of the voltage detection part produced when both of or either one of the high-side switching element and the low-side switching element are driven to assume the OFF state.

6. The control apparatus for a multi-phase rotary machine according to claim 1, further comprising:
a current detection part provided to detect a current, which flows in each phase of the windings or flows in the common bus of the legs; and
a voltage detection part provided to detect a voltage of each phase of the windings,
wherein the control unit determines presence or non-presence of occurrence of the short-circuiting failure and specifies a failure switching element of the switching elements, by comparing a current detection value of the current detection part with a predetermined current value and by comparing a voltage detection value of the voltage detection part or a voltage command value with a predetermined voltage value.

7. An electric power steering apparatus comprising:
the control apparatus for a multi-phase rotary machine according to claim 1.

8. A control apparatus for a multi-phase rotary machine for controlling driving of the multi-phase rotary machine including a plurality of winding sets, each of which is formed of a plurality of windings corresponding to a plurality of phases, respectively, the control apparatus comprising:
a plurality of inverter units forming a plurality of systems, each of the inverter units having a plurality of legs provided in correspondence to the plurality of phases, each of the legs including a high-side switching element and a low-side switching element; and
a control unit for driving the multi-phase rotary machine by calculating a voltage command value, which is a command value of a voltage applied to each of the windings, and by controlling ON/OFF switching of the high-side switching element and the low-side switching element based on the voltage command value,
wherein the control unit is configured to
in a case where a short-circuiting failure occurred between a common bus at a high-side or a low-side of the leg and any one of the phases of the windings even when the high-side switching element and the low-side switching element are controlled to assume the OFF states,
control both of the high-side switching element and the low-side switching element of the leg of a failure phase or switching elements of no failure among the legs of the failure system into OFF states, respectively,
continue to drive the multi-phase rotary machine by the leg of a no-failure phase among the legs of the failure system and the legs of the no-failure system, and control the high-side switching element and the low-side switching element of the no-failure system such that an output of the failure system is cancelled or an influence of the output exerted on the driving of the multi-phase rotary machine is reduced, the output being generated by driving the multi-phase rotary machine by the leg of the no-failure phase among the legs of the failure system.

9. The control apparatus for a multi-phase rotary machine according to claim 8, wherein:
the control unit, when the driving of the multi-phase rotary machine is continued by the leg of the no-failure phase among the legs of the failure system, controls the high-side switching element and the low-side switching element of the failure system for a predetermined time such that a voltage larger than a voltage in a normal time is applied to the phase which in among the phases of the failure system and has a high degree of contribution to a torque of the multi-phase rotary machine.

10. The control apparatus for a multi-phase rotary machine according to claim 9, further comprising:
a current detection part provided to detect a current, which flows in each phase of the windings or flows in the common bus of the legs,
wherein the control unit is configured to determine presence or non-presence of the short-circuiting failure based on a current detection value of the current detection part.

11. The control apparatus for a multi-phase rotary machine according to claim 9, further comprising:
a voltage detection part provided to detecting a voltage of each phase of the windings,
wherein the control unit determines presence or non-presence of occurrence of the short-circuiting failure and specifies a failure switching element of the switching elements, based on a voltage detection value of the voltage detection part produced when both of or either one of the high-side switching element and the low-side switching element are driven to assume the OFF state.

12. The control apparatus for a multi-phase rotary machine according to claim 9, further comprising:
a current detection part provided to detect a current, which flows in each phase of the windings or flows in the common bus of the legs; and
a voltage detection part provided to detect a voltage of each phase of the windings,
wherein the control unit determines presence or non-presence of occurrence of the short-circuiting failure and specifies a failure switching element of the switching elements, by comparing a current detection value of the current detection part with a predetermined current value and by comparing a voltage detection value of the voltage detection part or a voltage command value with a predetermined voltage value.

13. The control apparatus for a multi-phase rotary machine according to claim 8, further comprising:
a current detection part provided to detect a current, which flows in each phase of the windings or flows in the common bus of the legs,
wherein the control unit is configured to determine presence or non-presence of the short-circuiting failure based on a current detection value of the current detection part.

14. The control apparatus for a multi-phase rotary machine according to claim 8, further comprising:
a voltage detection part provided to detecting a voltage of each phase of the windings,
wherein the control unit determines presence or non-presence of occurrence of the short-circuiting failure and specifies a failure switching element of the switching elements, based on a voltage detection value of the voltage detection part produced when both of or either one of the high-side switching element and the low-side switching element are driven to assume the OFF state.

15. The control apparatus for a multi-phase rotary machine according to claim 8, further comprising:
   a current detection part provided to detect a current, which flows in each phase of the windings or flows in the common bus of the legs; and
   a voltage detection part provided to detect a voltage of each phase of the windings,
   wherein the control unit determines presence or non-presence of occurrence of the short-circuiting failure and specifies a failure switching element of the switching elements, by comparing a current detection value of the current detection part with a predetermined current value and by comparing a voltage detection value of the voltage detection part or a voltage command value with a predetermined voltage value.

16. An electric power steering apparatus comprising:
   the control apparatus for a multi-phase rotary machine according to claim 8.

* * * * *